United States Patent
Arisaka et al.

(10) Patent No.: US 9,257,386 B2
(45) Date of Patent: Feb. 9, 2016

(54) WIRING SUBSTRATE AND SEMICONDUCTOR DEVICE

(71) Applicant: SHINKO ELECTRIC INDUSTRIES CO., LTD., Nagano-ken (JP)

(72) Inventors: Hiromu Arisaka, Nagano (JP); Noriyoshi Shimizu, Nagano (JP); Masato Tanaka, Nagano (JP); Tetsuya Koyama, Nagano (JP); Akio Rokugawa, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 0 days.

(21) Appl. No.: 14/548,784

(22) Filed: Nov. 20, 2014

(65) Prior Publication Data

US 2015/0179560 A1     Jun. 25, 2015

(30) Foreign Application Priority Data

Dec. 20, 2013    (JP) ................... 2013264672

(51) Int. Cl.
*H01L 23/31*      (2006.01)
*H01L 23/498*     (2006.01)
(Continued)

(52) U.S. Cl.
CPC .... *H01L 23/49838* (2013.01); *H01L 23/49822* (2013.01); *H01L 23/49827* (2013.01); *H01L 25/105* (2013.01); *H05K 1/0298* (2013.01); *H05K 1/0313* (2013.01); *H05K 1/113* (2013.01); *H01L 23/3128* (2013.01); *H01L 2224/16225* (2013.01); *H01L 2224/32225* (2013.01); *H01L 2224/73204* (2013.01); *H01L 2225/1023* (2013.01); *H01L 2924/15174* (2013.01); *H01L 2924/15311* (2013.01); *H05K 2201/0137* (2013.01); *H05K 2201/029* (2013.01)

(58) Field of Classification Search
None
See application file for complete search history.

(56) References Cited

U.S. PATENT DOCUMENTS

2009/0145635 A1   6/2009   Shimizu
2010/0112804 A1*   5/2010   Kobayashi et al. ........... 438/637
(Continued)

FOREIGN PATENT DOCUMENTS

JP    2003-023252    1/2003
JP    2003-023253    1/2003
(Continued)

OTHER PUBLICATIONS

Japanese Office Action (with Translation); JP Appl. No. 2013-264672; Jul. 29, 2014; 8 pp.

*Primary Examiner* — Evren Seven

(74) *Attorney, Agent, or Firm* — Fish & Richardson P.C.

(57) ABSTRACT

A wiring substrate includes first and second wiring structures. The first wiring structure includes a core substrate, first and second insulation layers each formed from a thermosetting insulative resin including a reinforcement material, and a via wire formed in the first insulation layer. The second wiring structure includes a wiring layer formed on upper surfaces of the first insulation layer and the via wire, an insulation layer formed on the upper surface of the first insulation layer, and an uppermost wiring layer including a pad used to electrically connect a semiconductor chip and the wiring layer. An outermost insulation layer stacked on a lower surface of the second insulation layer exposes a portion of a lowermost wiring layer stacked on the lower surface of the second insulation layer as an external connection pad. The second wiring structure has a higher wiring density than the first wiring structure.

16 Claims, 23 Drawing Sheets

(51) Int. Cl.
  *H01L 25/10* (2006.01)
  *H05K 1/11* (2006.01)
  *H05K 1/02* (2006.01)
  *H05K 1/03* (2006.01)
  *H01L 21/00* (2006.01)

(56) References Cited

U.S. PATENT DOCUMENTS

| | | | |
|---|---|---|---|
| 2011/0079913 A1* | 4/2011 | Chino | 257/773 |
| 2011/0169164 A1* | 7/2011 | Nakamura et al. | 257/739 |
| 2011/0227214 A1* | 9/2011 | Tateiwa et al. | 257/734 |
| 2012/0119377 A1 | 5/2012 | Muramatsu et al. | |
| 2012/0306608 A1* | 12/2012 | Takenaka | H05K 1/165 336/200 |
| 2012/0326334 A1* | 12/2012 | Sakaguchi | 257/778 |
| 2013/0069251 A1* | 3/2013 | Kunimoto et al. | 257/784 |
| 2013/0119562 A1* | 5/2013 | Shimizu et al. | 257/782 |
| 2013/0249075 A1* | 9/2013 | Tateiwa et al. | 257/734 |
| 2013/0264100 A1* | 10/2013 | Horiuchi | 174/251 |
| 2014/0070396 A1* | 3/2014 | Kyozuka et al. | 257/698 |

FOREIGN PATENT DOCUMENTS

| | | |
|---|---|---|
| JP | 2006-173333 | 6/2006 |
| JP | 2007-073766 | 3/2007 |
| JP | 2009-141121 | 6/2009 |
| JP | 2010-129725 | 6/2010 |
| JP | 2011-135034 | 7/2011 |
| JP | 2012-104774 | 5/2012 |
| JP | 2013-219228 | 10/2013 |

* cited by examiner

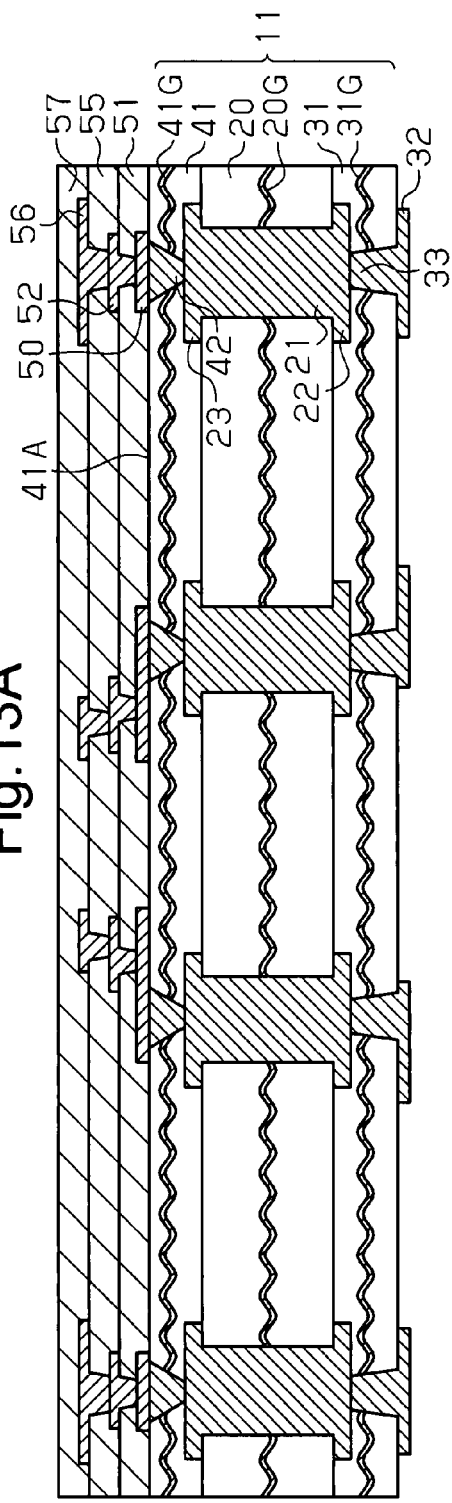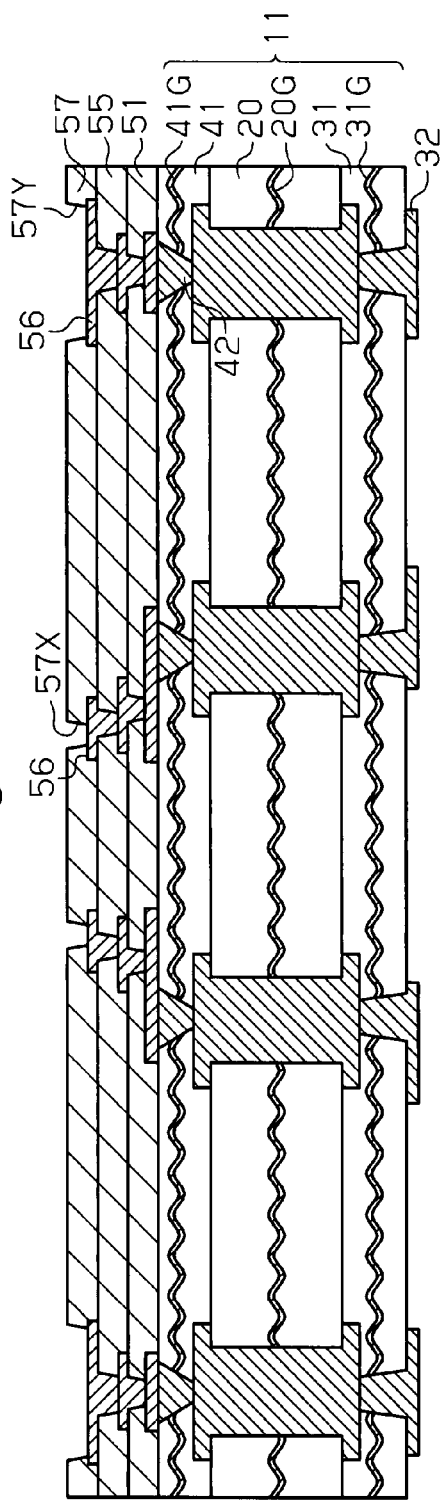

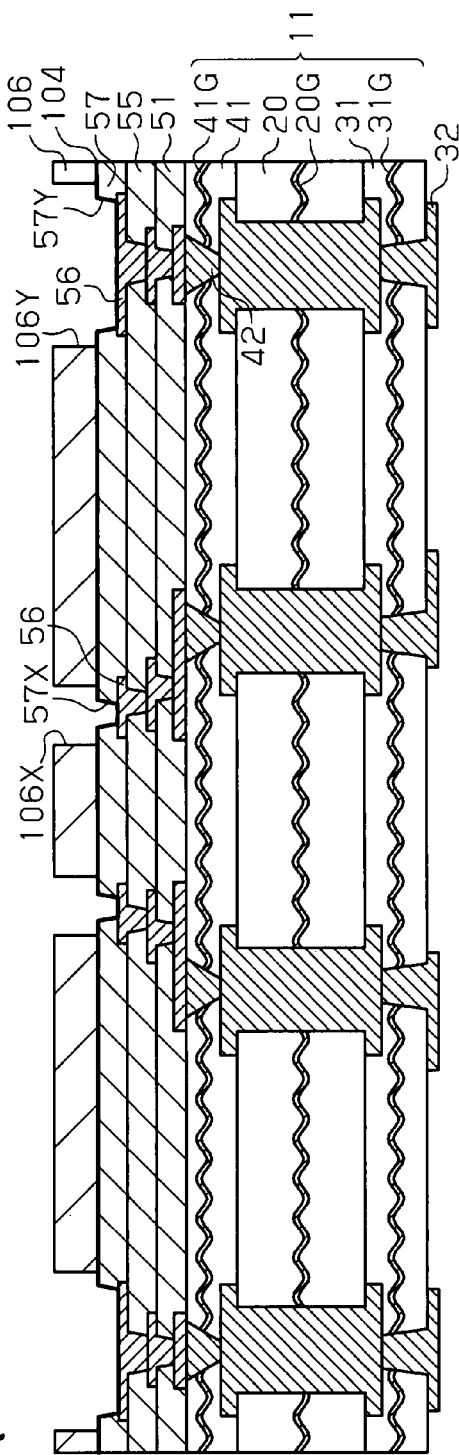
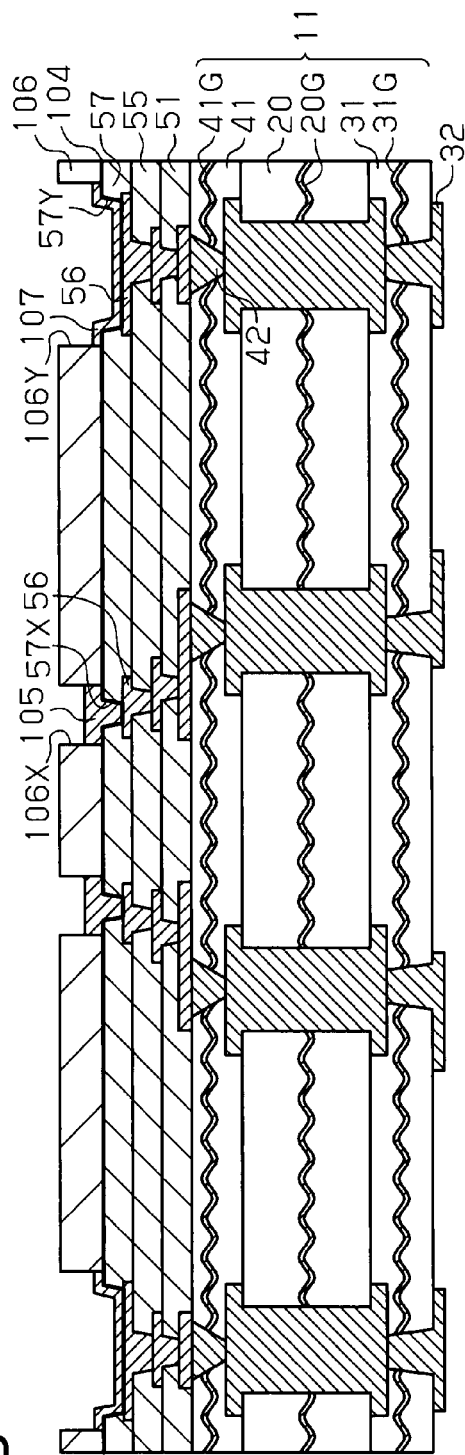

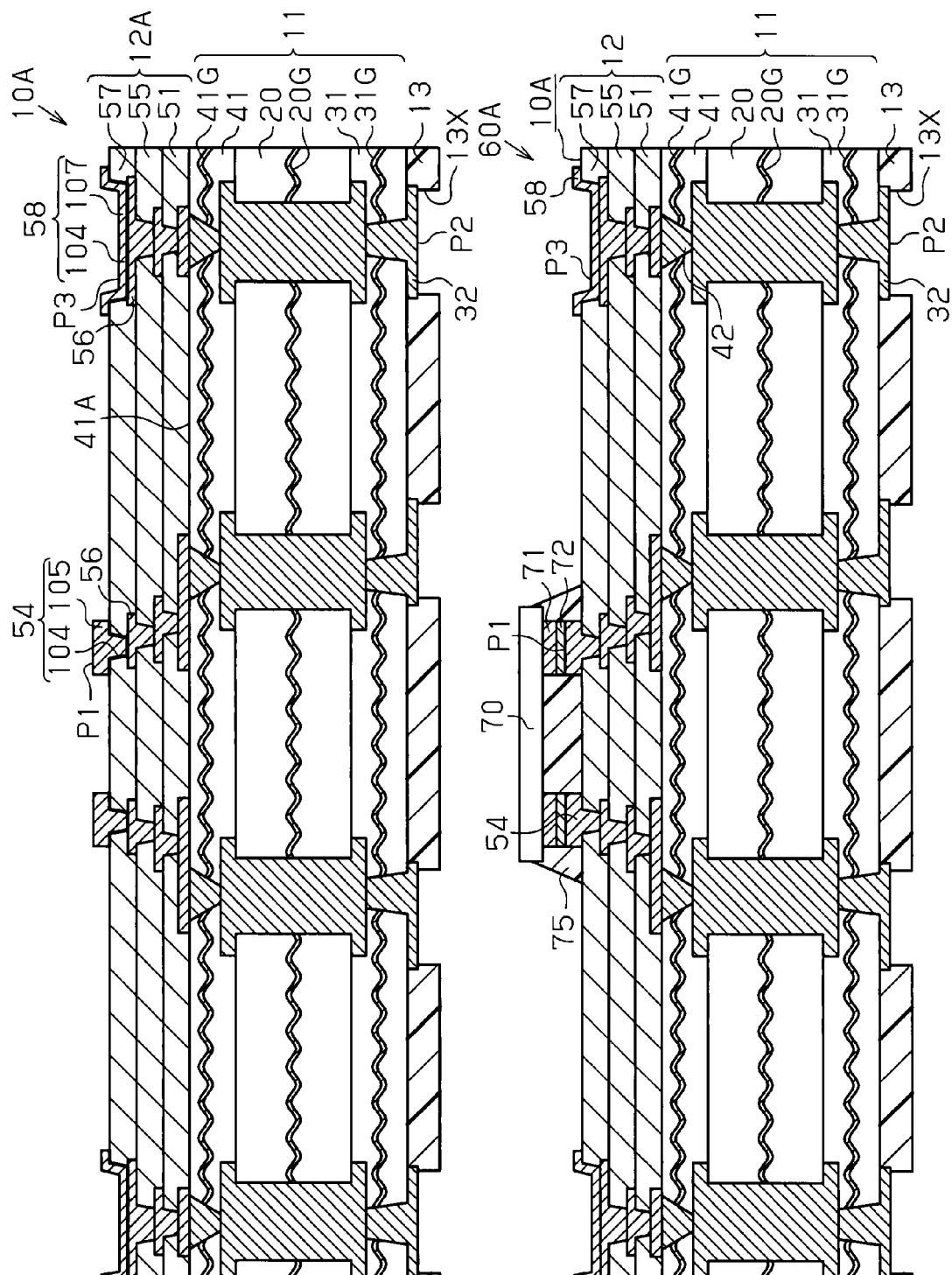

● Reinforcement Material not included
▲ Reinforcement Material included Unpolished
■ Reinforcement Material included Polished Removed Amount: 2.5 μm
◆ Reinforcement Material included Polished Removed Amount: 5 μm
▼ Reinforcement Material included Polished Removed Amount: 7.5 μm

WIRING SUBSTRATE AND SEMICONDUCTOR DEVICE

CROSS-REFERENCE TO RELATED APPLICATIONS

This application is based upon and claims the benefit of priority from prior Japanese Patent Application No. 2013-264672, filed on Dec. 20, 2013, the entire contents of which are incorporated herein by reference.

FIELD

This disclosure relates to a wiring substrate, a semiconductor device, and a method for manufacturing a wiring substrate.

BACKGROUND

Conventionally, a build-up wiring substrate is known as a wiring substrate used for a semiconductor package and the like. Japanese Laid-Open Patent Publication No. 2003-023252 and Japanese Laid-Open Patent Publication No. 2003-023253 describe conventional examples of a build-up wiring substrate. In these patent publications, a wiring layer and an insulation layer are stacked on each of upper and lower surfaces of a core substrate to increase the density of wiring patterns.

In recent years, electronic components, such as a semiconductor chip mounted on a build-up wiring substrate, are further increased in density while being reduced in size. The build-up wiring substrate needs denser and finer wiring patterns and smaller and thinner wiring substrates.

SUMMARY

When a core substrate is thinned so that the build-up wiring substrate is thinned, the mechanical strength of the core substrate decreases. In recent years, as the number of terminals of a semiconductor chip increases, the number of through electrodes, which extend through the core substrate in the thicknesswise direction, increases. When the number of through electrodes increases, a larger amount of a reinforcement material arranged in the core substrate is split. This lowers mechanical strength of the core substrate. When the mechanical strength of the core substrate is lowered, the rigidity of the build-up wiring substrate is lowered. This tends to generate warpage in the wiring substrate.

In one aspect of this disclosure, a wiring substrate includes a first wiring structure and a second wiring structure. The first wiring structure includes a core substrate, a first insulation layer stacked on an upper surface of the core substrate and formed from a thermosetting insulative resin including a first reinforcement material, a second insulation layer stacked on a lower surface of the core substrate and formed from a thermosetting insulative resin including a second reinforcement material, and a via wire formed in the first insulation layer. The second wiring structure includes a plurality of third insulation layers, of which the main component is a photosensitive resin, formed on an upper surface of the first insulation layer, and a plurality of first wiring layers alternately formed in the plurality of third insulation layers at the upper surface of the first insulation layer. The plurality of first wiring layers include a lowermost first wiring layer formed on the upper surface of the first insulation layer and an upper end surface of the via wire, and an uppermost first wiring layer including a pad used to electrically connect a semiconductor chip and the lowermost first wiring layer. The wiring substrate further includes a second wiring layer and an outermost insulation layer. The second wiring layer is stacked on a lower surface of the second insulation layer. The outermost insulation layer is stacked on the lower surface of the second insulation layer to cover the second wiring layer. The main component of the outermost insulation layer is a photosensitive resin. The outermost insulation layer includes an opening that exposes a portion of the second wiring layer as an external connection pad. The second wiring structure has a higher wiring density than the first wiring structure.

In another aspect of this disclosure, a method for manufacturing a wiring substrate includes preparing a core substrate, stacking a first insulation layer that is formed from a thermosetting insulative resin including a first reinforcement material on an upper surface of the core substrate, stacking a second insulation layer that is formed from a thermosetting insulative resin including a second reinforcement material on a lower surface of the core substrate, forming a through hole that extends through the first insulation layer in a thicknesswise direction, forming a conductive layer that fills the through hole and covers an upper surface of the first insulation layer, polishing the conductive layer and the upper surface of the first insulation layer so that the first reinforcement material is located upper than the centerline of the first insulation layer in the thicknesswise direction and so that a via wire, which includes an upper end surface exposed on the upper surface of the first insulation layer, is formed in the through hole, stacking a second wiring structure, which includes a wiring layer and an insulation layer, the main component of which is a photosensitive resin, on the upper surface of the first insulation layer, and stacking an outermost insulation layer, the main component of which is a photosensitive resin, on a lower surface of the second insulation layer.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 3C is a partial enlarged cross-sectional view of a structure illustrated in FIG. 3B, FIG. 4B is a partial enlarged cross-sectional view of a structure illustrated in FIG. 4A, FIG. 5B is a partial enlarged cross-sectional view of a structure illustrated in FIG. 5A, FIG. 7B is a partial enlarged cross-sectional view of a structure illustrated in FIG. 7A, and FIG. 9B is a partial enlarged cross-sectional view of a structure illustrated in FIG. 9A;

FIGS. 13A, 13B, 14A, 14B, and 15A are schematic cross-sectional views illustrating a method for manufacturing the wiring substrate of FIG. 11;

FIG. 15B is a schematic cross-sectional view illustrating a method for manufacturing the semiconductor package of FIG. 11;

DESCRIPTION OF THE EMBODIMENTS

Figure 1A:
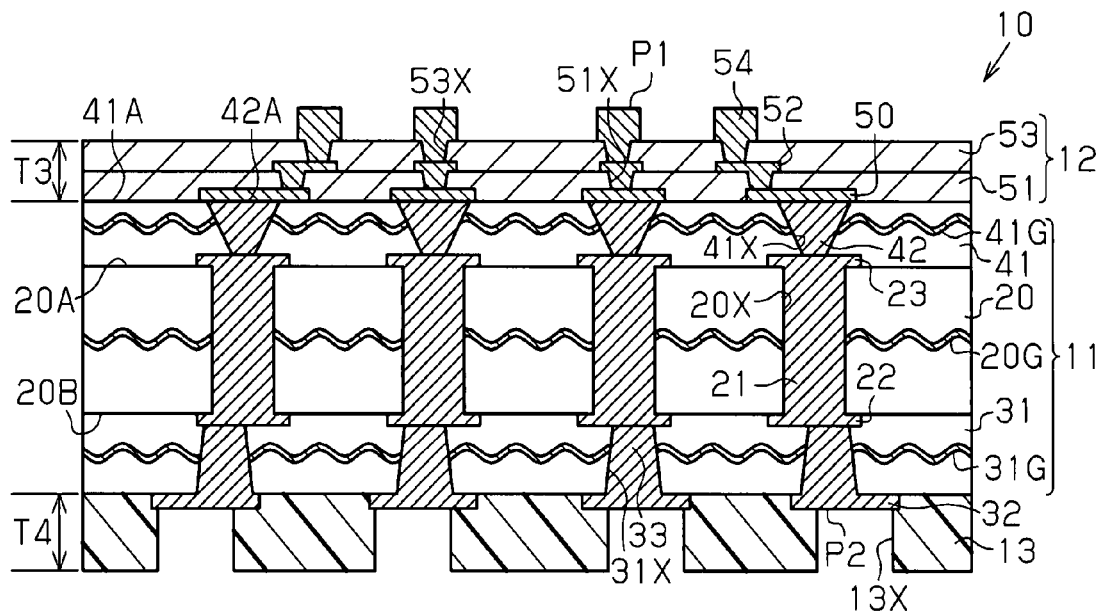
FIG. 1A is a schematic cross-sectional view illustrating a wiring substrate of a first embodiment.

Various embodiments will now be described with reference to the accompanying drawings. Elements in the drawings are illustrated for simplicity and clarity and have not necessarily been drawn to scale. In the cross-sectional views, hatching of some elements is omitted and the hatching of some elements is changed to be shaded for clarity.

First Embodiment

A first embodiment will now be described with reference to FIGS. 1A to 10B.

As illustrated in FIG. 1A, a wiring substrate 10 includes a wiring structure 11, a wiring structure 12 stacked on one side (here, upper side) of the wiring structure 11, and a solder resist layer 13 stacked on the other side (here, lower side) of the wiring structure 11. The wiring substrate 10 may have any shape and size as viewed from above. For example, the surface of the wiring substrate 10 may be square with sides of approximately 10 mm.

The structure of the wiring structure 11 will now be described.

The wiring structure 11 is a low-density wiring layer, which includes a wiring layer with wiring density lower than that of the wiring structure 12. The wiring structure 11 includes a core substrate 20, an insulation layer 31 stacked on a lower surface 20B of the core substrate 20, and an insulation layer 41 stacked on an upper surface 20A of the core substrate 20.

For example, a thermosetting insulative resin including a reinforcement material may be used as the material of the core substrate 20 and the insulation layers 31 and 41. For example, a glass epoxy resin may be used as the material of the core substrate 20 and the insulation layers 31 and 41. A glass epoxy resin is obtained by impregnating a thermosetting insulative resin, the main component of which is an epoxy resin, in a glass cloth (glass woven cloth) as a reinforcement material and curing the resin. The thermosetting insulative resin is not limited to an epoxy resin. For example, a polyimide resin or a cyanate resin may be used. The core substrate 20 and the insulation layers 31 and 41 may include, for example, a filler such as silica or alumina.

The core substrate 20 includes a predetermined number (one in FIG. 1A) of a glass cloth 20G. The insulation layer 31 includes a predetermined number (one in FIG. 1A) of a glass cloth 31G. The insulation layer 41 includes a predetermined number (one in FIG. 1A) of a glass cloth 41G.

Figure 1B:
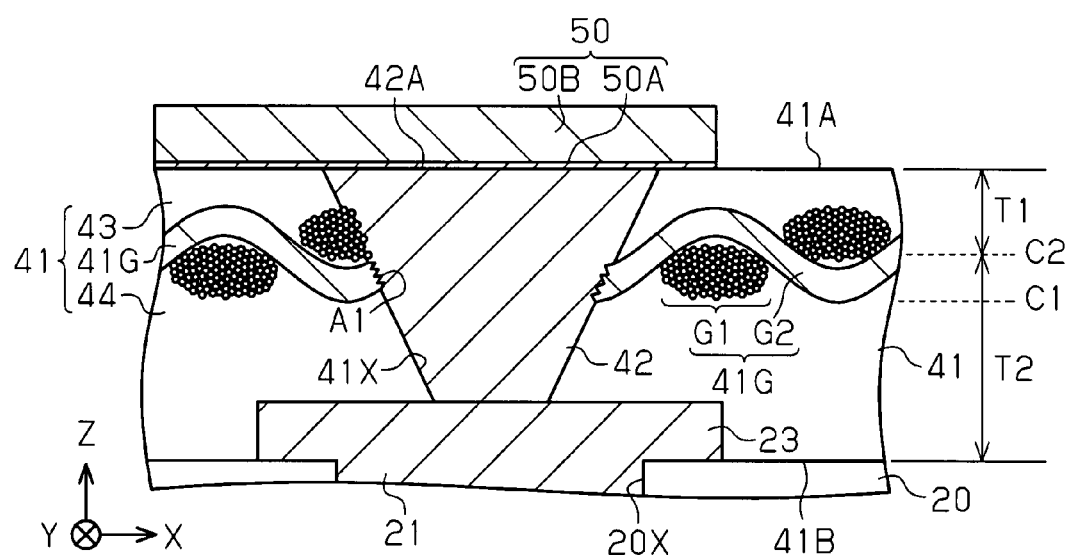
FIG. 1B is a partial enlarged cross-sectional view of the wiring substrate illustrated in FIG. 1A.

As illustrated in FIG. 1B, for example, the glass cloth 41G has a structure in which glass fiber bundles G1 arranged side by side in the X direction and glass fiber bundles G2 arranged side by side in the Y direction are plain woven to a lattice-form. The glass fiber bundles G1 and G2 are each obtained by bundling a plurality of glass fibers. The diameter of each glass fiber is, for example, approximately 1 to 2 μm. The thickness of each glass fiber bundle G1 and G2 may be, for example, approximately 15 to 20 μm. Although, in FIG. 1B, the glass fibers of the glass fiber bundle G1 are illustrated, in enlarged cross-sectional views of FIGS. 3C, 4B, 5B, 7B, and 9B, the glass fibers are not illustrated. Instead, a cross-sectional shape of the glass fiber bundle G1 is indicated by an elliptic shape. The entire cross-sectional shape of each glass fiber bundle G1 and G2 including the glass fibers is not particularly limited, and, for example, may be elliptic or circular. Although the illustration is omitted, the glass clothes 20G and 31G each have the same structure as the glass cloth 41G.

Instead of the glass clothes 20G, 31G, and 41G using the glass fiber bundles G1 and G2, woven cloth or non-woven cloth using carbon fiber bundle, polyester fiber bundle, nylon fiber bundle, aramid fiber bundle, liquid crystal polymer fiber bundle, and the like may be used for the reinforcement material. The weaving manner of the fiber bundles is not limited to plain weaving, and may be sateen weaving, twill weaving, and the like.

As illustrated in FIG. 1A, the core substrate 20 is arranged in the middle of the wiring structure 11 in the thicknesswise direction. The thickness of the core substrate 20 may be, for example, approximately 80 to 800 μm. The glass cloth 20G is arranged in the middle of the core substrate 20 in the thicknesswise direction.

Through holes 20X are formed in predetermined locations (four locations, in FIG. 1A) of the core substrate 20. The through hole 20X extends through the core substrate 20 from the upper surface 20A to the lower surface 20B. The through hole 20X splits the glass cloth 20G. A through electrode 21, which extends through the core substrate 20 in the thicknesswise direction, is formed in the through hole 20X. That is, the through hole 20X is filled with the through electrode 21. Although the illustration is omitted, the through hole 20X and the through electrode 21 each have, for example, a circular shape as viewed from above. The diameter of the through hole 20X and the through electrode 21 may be, for example, approximately 100 to 200 μm. The pitch of the through hole 20X and the pitch of the through electrode 21 may be, for example, approximately 200 to 400 μm. For example, copper (Cu) or a copper alloy may be used as the material of the through electrode 21.

A wiring layer 22 is formed on the lower surface 20B of the core substrate 20. A wiring layer 23 is formed on the upper surface 20A of the core substrate 20. The through electrode 21 electrically connects the wiring layers 22 and 23 to each other. The thickness of each wiring layer 22 and 23 may be, for example, approximately 15 to 35 μm. In each of the wiring layers 22 and 23, the wire width/wire interval (line L/space S) may be, for example, approximately 20 μm/20 μm. For example, copper or a copper alloy may be used as the material of the wiring layers 22 and 23.

The insulation layer 31 and the wiring layer 32 are sequentially stacked on the lower surface 20B of the core substrate 20. The insulation layer 31 is stacked on the lower surface 20B of the core substrate 20 so that the wiring layer 22 is covered. The thickness of the insulation layer 31 is, for example, smaller than that of the core substrate 20. For example, the thickness of the insulation layer 31 may be approximately 40 to 75 μm. The insulation layer 31, which includes the glass cloth 31G serving as the reinforcement material, has high mechanical strength (rigidity and hardness). The glass cloth 31G is arranged in the middle of the insulation layer 31 in the thicknesswise direction.

A through hole 31X, which extends through the insulation layer 31 in the thicknesswise direction, is formed in a predetermined location of the insulation layer 31. The through hole 31X splits the glass cloth 31G. A via wire 33, which electrically connects the wiring layers 22 and 32, is formed in the through hole 31X. That is, the through hole 31X is filled with the via wire 33. The through hole 31X and the via wire 33 are tapered such that the diameter reduces from the lower side (wiring layer 32) toward the upper side (core substrate 20) in FIG. 1A. For example, the through hole 31X has a truncated circular cone shape such that the upper open end has an opening diameter smaller than an opening diameter of the lower open end. In the same manner, the via wire 33 has a truncated circular cone shape such that the upper surface has a diameter smaller than a diameter of the lower surface. The opening diameter of the lower open end of the through hole 31X and the diameter of the lower surface of the via wire 33 are smaller than the diameter of the through electrode 21. For example, the opening diameter of the lower open end of the through hole 31X may be approximately 50 to 70 μm, and the diameter of the lower surface of the via wire 33 may be approximately 50 to 70 μm.

The wiring layer 32 is stacked on the lower surface of the insulation layer 31. The via wire 33 electrically connects the wiring layer 32 to the wiring layer 22. For example, the thickness of the wiring layer 32 may be approximately 15 to 35 μm. For example, the L/S of the wiring layer 32 may be approximately 20 μm/20 μm. For example, copper or a copper alloy may be used as the material of the wiring layer 32.

The insulation layer 41 and a via wire 42 (wiring layer), which is arranged in the insulation layer 41, are stacked on the upper surface 20A of the core substrate 20.

The insulation layer 41 is stacked on the upper surface 20A of the core substrate 20 so that the wiring layer 23 is covered. For example, the insulation layer 41 has a thickness smaller than the core substrate 20 and the insulation layer 31. For example, the thickness of the insulation layer 41 may be approximately 35 to 70 μm. The insulation layer 41, which includes the glass cloth 41G serving as the reinforcement material, has high mechanical strength (rigidity and hardness).

As illustrated in FIG. 1B, the insulation layer 41 includes the glass cloth 41G, a resin layer 43 covering the upper surface of the glass cloth 41G, and a resin layer 44 covering the lower surface of the glass cloth 41G. The glass cloth 41G is located above the central position C1 of the insulation layer 41 in the thicknesswise direction. In other words, the central position C2 of the glass cloth 41G in the thicknesswise direction is located on an upper side of the central position C1 of the insulation layer 41 in the thicknesswise direction. The thickness T1 of the resin layer 43, which corresponds to the thickness from the upper surface 41A of the insulation layer 41 to the central position C2 of the glass cloth 41G, is smaller than the thickness T2 of the resin layer 44, which corresponds to the thickness from the central position C of the glass cloth 41G to the lower surface 41B of the insulation layer 41. The thickness T1 of the resin layer 43 is set relative to the thickness T1 of the resin layer 44 so that the glass cloth 41G is arranged in the middle of the total thickness of the wiring structure 12 (refer to FIG. 1A) and the insulation layer 41. For example, the thickness T1 of the resin layer 43 may be approximately 15 to 35 μm, and the thickness T2 of the resin layer 44 may be approximately 20 to 40 μm. For example, the thickness from the upper surface of the glass cloth 41G to the upper surface of the resin layer 43 may be 10 to 15 μm, and the thickness from the lower surface of the glass cloth 41G to the lower surface of the resin layer 44 may be approximately 15 to 20 μm.

A through hole 41X is formed in a predetermined location of the upper surface 41A of the insulation layer 41. The through hole 41X extends through the insulation layer 41 in the thicknesswise direction and exposes a portion of the upper surface of the wiring layer 23. The through hole 41X is tapered such that the diameter reduces from the upper side (wiring structure 12) toward the lower side (core substrate 20) in FIG. 1B. For example, the through hole 41X has an inverted truncated circular cone shape such that the lower open end has an opening diameter smaller than an opening diameter of the upper open end. The opening diameter of the upper open end of the through hole 41X is smaller than the diameter of the through electrode 21. For example, the opening diameter of the upper open end of the through hole 41X may be approximately 50 to 70 μm.

The through hole 41X splits the glass cloth 41G. An end portion A1 of the split glass cloth 41G projects from a side wall of the through hole 41X toward an inner side of the through hole 41X. The end portion A1 of the glass cloth 41G has a greater surface roughness than the resin layers 43 and 44, which form the side wall of the through hole 41X.

The upper surface 41A of the insulation layer 41 is smooth and flat including a few irregularities (low surface roughness). For example, the upper surface 41A of the insulation layer 41 has a lower surface roughness than the side wall of the through hole 41X. The surface roughness of the upper surface 41A of the insulation layer 41 is set to be, for example, between 15 and 40 nm in surface roughness value Ra. The surface roughness of the side wall of the through hole 41X is set to be, for example, between 300 and 400 nm in surface roughness value Ra. The surface roughness value Ra is an index representing the surface roughness, and is called an arithmetic average roughness. More specifically, the surface roughness value Ra is obtained by measuring the absolute value of the height that changes within the measurement region from the surface of the average height and by taking the arithmetic average of the measurement values.

The via wire 42, which is electrically connected to the wiring layer 23, is formed in the through hole 41X. The via wire 42 extends through the insulation layer 41 in the thicknesswise direction. That is, the through hole 41X is filled with the via wire 42. In the same manner as the through hole 41X, the via wire 42 is tapered such that the diameter reduces from the upper side (wiring structure 12) toward the lower side (wiring layer 23) in FIG. 1B. For example, the via wire 42 has an inverted truncated circular cone shape such that an upper end surface 42A has a diameter greater than a diameter of an lower end surface. The upper end surface 42A of the via wire 42 is exposed on the upper surface 41A of the insulation layer 41. For example, the upper end surface 42A of the via wire 42 is substantially flush with the upper surface 41A of the insulation layer 41. For example, the diameter of the upper end surface 42A of the via wire 42 may be approximately 50 to 70 µm. For example, copper or a copper alloy may be used as the material of the via wire 42.

The via wire 42 covers the entire surface of the end portion A1 of the glass cloth 41G, which projects from the side wall of the through hole 41X toward the inner side of the through hole 41X.

The structure of the wiring structure 12 will now be described.

As illustrated in FIG. 1A, the wiring structure 12 is stacked on the upper surface 41A of the uppermost insulation layer 41 of the wiring structure 11. The wiring structure 12 is a high-density wiring layer, which includes a wiring layer of a higher density than the wiring structure 11.

The wiring structure 12 has a structure in which a wiring layer 50, an insulation layer 51, a wiring layer 52, an insulation layer 53, and a wiring layer 54 are sequentially stacked on the insulation layer 41. A thickness T3 of the wiring structure 12 is indicated by the total thickness of the insulation layers 51 and 53, which corresponds to the thickness from the upper surface 41A of the insulation layer 41 to an upper surface of the insulation layer 53. The thickness T3 may be, for example, approximately 10 to 40 µm.

For example, copper or a copper alloy may be used as the material of the wiring layers 50, 52 and 54. For example, a photosensitive insulative resin, the main component of which is a phenol resin or a polyimide resin, may be used as the material of the insulation layers 51 and 53. The insulation layers 51 and 53 may include a filler, such as silica or alumina.

The wiring layers 50, 52, and 54 are each thinner than the wiring layer of the wiring structure 11. For example, the thickness of the wiring layers 50 and 52 formed on the insulation layers 41 and 51 may be each approximately 1 to 3 µm. For example, the thickness of the wiring layer 54 formed on the insulation layer 53 may be approximately 10 to 15 µm. For example, the L/S of the wiring layers 50, 52, and 54 may be approximately 2 µm/2 µm. The insulation layers 51 and 53 are each thinner than the insulation layer of the wiring structure 11. For example, the thickness of the insulation layers 51 and 53 may be approximately 3 to 10 µm.

As illustrated in FIG. 1B, the wiring layer 50 is stacked on the upper surface 41A of the insulation layer 41 so that the wiring layer 50 is connected to the upper end surface 42A of the via wire 42. That is, a portion of a lower surface of the wiring layer 50 contacts the upper end surface 42A of the via wire 42 so that the wiring layer 50 is electrically connected to the via wire 42. In other words, although the wiring layer 50 is electrically connected to the via wire 42, the wiring layer 50 is not integrated with the via wire 42. The wiring layer 50 includes, for example, a seed layer 50A (for example, a stacked unit of titanium (Ti) and copper), which is formed on the upper end surface 42A of the via wire 42 (for example, a layer of copper (Cu)), and a metal layer 50B (for example, a layer of Cu), which is formed on the seed layer 50A. Therefore, the metal layer 50B is not electrically connected to the via wire 42 by the seed layer 50A.

The seed layer 50A covers the upper end surface 42A of the via wire 42 and the upper surface 41A of the insulation layer 41 that is located around the upper end surface 42A. A metal film formed by sputtering (sputter film) may be used as the seed layer 50A. The seed layer 50A obtained by sputtering may be formed using a metal film having a two-layer structure in which, for example, a layer of Ti formed by titanium (Ti) and a layer of Cu formed by copper (Cu) are sequentially stacked on the upper end surface 42A of the via wire 42 and the upper surface 41A of the insulation layer 41. In this case, the thickness of the layer of Ti may be, for example, approximately 20 to 50 nm, and the thickness of the layer of Cu may be, for example, approximately 100 to 300 nm. The layer of Ti functions as a metal barrier film, which impedes the diffusion of copper from the layer of Cu and the metal layer 50B (layer of Cu) to the insulation layer 41. As the material of the metal film functioning as a metal barrier film, titanium nitride (TiN), tantalum nitride (TaN), tantalum (Ta), or chromium (Cr) may be used other than Ti.

The metal layer 50B entirely covers an upper surface of the seed layer 50A. An electrolytic plating metal layer may be used as the metal layer 50B. For example, copper or a copper alloy may be used as the material of the metal layer 50B.

As illustrated in FIG. 1A, the insulation layer 51 is formed on the upper surface 41A of the insulation layer 41 to cover the wiring layer 50. A through hole 51X is formed in a predetermined location of the insulation layer 51. The through hole 51X extends through the insulation layer 51 in the thicknesswise direction and exposes a portion of the upper surface of the wiring layer 50. The through hole 51X is tapered such that the diameter reduces from the upper side (insulation layer 53) toward the lower side (wiring layer 50) in FIG. 1A. For example, the through hole 51X has an inverted truncated circular cone shape such that the upper open end has an opening diameter greater than an opening diameter of the lower open end. For example, the opening diameter of the upper open end of the through hole 51X may be approximately 10 to 20 µm.

The wiring layer 52 is stacked on the upper surface of the insulation layer 51. The wiring layer 52 is electrically connected to the wiring layer 50. The wiring layer 52 includes a via wire, which fills the through hole 51X, and a wiring pattern, which is formed on the upper surface of the insulation layer 51.

The insulation layer 53 is formed on the upper surface of the insulation layer 51 and covers the wiring layer 52. A through hole 53X is formed in a predetermined location of the insulation layer 53. The through hole 53X extends through the insulation layer 53 in the thicknesswise direction and exposes a portion of the upper surface of the wiring layer 52. The through hole 53X is tapered such that the diameter reduces from the upper side (pad P1) toward the lower side (wiring layer 52) in FIG. 1A. For example, the through hole 53X has an inverted truncated circular cone shape such that the upper open end has an opening diameter greater than an opening diameter of the lower open end. For example, the opening diameter of the upper open end of the through hole 53X may be approximately 10 to 20 µm.

The wiring layer 54 is stacked on the upper surface of the insulation layer 53. The wiring layer 54 is electrically connected to the wiring layer 52. The wiring layer 54 includes a via wire, which fills the through hole 53X, and a pad P1, which projects upward from the upper surface of the insulation layer 53. The pad P1 may have any shape and size as viewed from above. For example, the pad P1 may be circular with a diameter of approximately 20 to 30 µm as viewed from above. The pitch of the pad P1 may be, for example, approximately 40 to 50 µm. The pad P1 is used to electrically connect to an electronic component, such as a semiconductor chip.

If necessary, a surface-processed layer may be formed on the surface (upper and side surfaces, or only upper surface) of the pad P1. Examples of the surface-processed layer are a layer of gold (Au), a layer of nickel (Ni)/Au (a metal layer in which an Ni layer and an Au layer are sequentially stacked), and a layer of Ni/palladium (Pd)/Au (a metal layer in which an Ni layer, a Pd layer, and an Au layer are sequentially stacked). For example, an electroless plating metal layer may be used as the layer of Ni, the layer of Au, or the layer of Pd.

The layer of Ni is a metal layer formed from Ni or an Ni alloy. The layer of Au is a metal layer formed from Au or an Au alloy. The layer of Pd is a metal layer formed from Pd or a Pd alloy. The surface-processed layer may be formed by performing an anti-oxidation process, such as an organic solderability preservative (OSP) process.

The solder resist layer 13 is formed on the lower surface of the wiring structure 11. The solder resist layer 13 is the outermost insulation layer (here, lowermost) arranged in the wiring substrate 10. The solder resist layer 13 is stacked on the lower surface of the lowermost insulation layer 31 of the wiring structure 11 to cover the lowermost wiring layer 32 of the wiring structure 11.

The solder resist layer 13 includes an opening 13X, which exposes a portion of the lowermost wiring layer 32 as an external connection pad P2. The external connection pad P2 is capable of connecting to an external connection terminal 76 (refer to FIG. 2), such as a solder ball or a lead pin, which is used when the wiring substrate 10 is mounted on a mount substrate such as a motherboard. If necessary, the wiring layer 32 (external connection pad P2), which is exposed in the opening 13X, may include a surface-processed layer. Examples of the surface-processed layer are a layer of Au, a layer of Ni/Au (a metal layer in which an Ni layer and an Au layer are sequentially stacked), and a layer of Ni/Pd/Au (a metal layer in which an Ni layer, a Pd layer, and an Au layer are sequentially stacked). For example, an electroless plating metal layer may be used as the Ni layer, the Au layer, or the Pd layer. A surface-processed layer may be formed by performing an anti-oxidation process, such as the OSP process. The wiring layer 32, which is exposed in the opening 13X, may be used as an external connection terminal. The surface-processed layer formed on the wiring layer 32 may be used as an external connection terminal.

Each of the opening 13X and the external connection pad P2 may have any shape or size as viewed from above. For example, each of the opening 13X and the external connection pad P2 may be circular with a diameter of approximately 200 to 300 μm as viewed from above. For example, a photosensitive insulative resin, the main component of which is a phenol resin or a polyimide resin, may be used as the material of the solder resist layer 13. The solder resist layer 13 may include a filler, such as silica or alumina.

The thickness T4 of the solder resist layer 13, that is, the thickness from the lower surface of the insulation layer 31 to the lower surface of the solder resist layer 13, is greater than or equal to the thickness T3 of the wiring structure 12. For example, when the thickness T3 of the wiring structure 12 is 30 μm, the thickness T4 of the solder resist layer 13 may be approximately 30 to 40 μm. Preferably, the ratio of the thickness T3 of the wiring structure 12 to the thickness T4 of the solder resist layer 13, that is, T3/T4 is less than or equal to one. More preferably, T3/T4 is one. The thickness of the solder resist layer 13 set in this manner reduces the warpage amount of the wiring substrate 10.

In the wiring substrate 10, preferably, the elastic modulus of the core substrate 20 is approximately 30 GPa. Preferably, the coefficient of thermal expansion of the core substrate 20 is approximately 10 ppm/° C. Preferably, the elastic modulus of the insulation layers 31 and 41, each of which contains a thermosetting resin as the main component and includes a reinforcement material, is approximately 15 to 30 GPa. Preferably, the coefficient of thermal expansion of the insulation layers 31 and 41 is approximately 10 to 20 ppm/° C. Preferably, the elastic modulus of the insulation layers 51 and 53, the main component of which is a photosensitive resin, is approximately 5 GPa. Preferably, the coefficient of thermal expansion of the insulation layers 51 and 53 is approximately 50 to 70 ppm/° C. Preferably, the elastic modulus of the solder resist layer 13, the main component of which is a photosensitive resin, is approximately 2 to 4 GPa. Preferably, the coefficient of thermal expansion of the solder resist layer 13 is approximately 40 to 50 ppm/° C.

The coefficient of thermal expansion of each insulation layer may be adjusted to a desirable value, for example, in correspondence with the contained amount of a filler. However, in the insulation layer, the main component of which is a photosensitive resin, exposure cannot be accomplished when the contained amount of the filler is increased. This limits the (maximum) amount of the filler that can be contained. Thus, there is a tendency in which the coefficient of thermal expansion of the insulation layer, the main component of which is a photosensitive resin, is greater than that of the insulation layer, the main component of which is a thermosetting resin. Other than silica or alumina as described above, for example, kaolin ($Al_2Si_2O_5$ $(OH_4)$) or talc ($Mg_3Si_4O_{10}(OH_2)$) may be used as a filler. Alternatively, kaolin and talc may be used together.

By setting the above physical properties (elastic modulus and coefficient of thermal expansion), the wiring substrate 10 gradually softens from the core substrate 20 toward the outer layers. This limits the warpage of the wiring substrate 10 together with the synergy effect of the above relationship of the thickness T4 of the solder resist layer 13 and the thickness T3 of the wiring structure 12.

The structure of a semiconductor device 60 (semiconductor package) will now be described in accordance with FIG. 2.

The semiconductor package 60 includes the wiring substrate 10, one or more semiconductor chips 70, an underfill resin 75, and the external connection terminal 76.

The semiconductor chip 70 is flip-chip-mounted on the wiring substrate 10. More specifically, a joint member 72 joins the pad P1 of the wiring substrate 10 with a connection terminal 71 arranged on a surface of the semiconductor chip 70 where a circuit is formed (here, lower surface). This electrically connects the semiconductor chip 70 to the pad P1 (wiring layer 54) through the connection terminal 71 and the joint member 72.

A logic chip, such as a central processing unit (CPU) or a graphics processing unit (GPU), may be used as the semiconductor chip 70. Also, a memory chip, such as a dynamic random access memory (DRAM) chip, a static random access memory (SRAM) chip, or a flash memory chip, may be used as the semiconductor chip 70. When a plurality of the semiconductor chips 70 are mounted on the wiring substrate 10, a logic chip and a memory chip may be mounted on the wiring substrate 10 together. For example, a CPU chip and a DRAM chip may be mounted on the wiring substrate 10, and a GPU chip and a DRAM chip may be mounted on the wiring substrate 10.

For example, the size of the semiconductor chip 70 may be approximately 3 mm×3 mm to 12 mm×12 mm as viewed from above. For example, the thickness of the semiconductor chip 70 may be approximately 50 to 100 μm.

For example, a metal post may be used as the connection terminal 71. The connection terminal 71 is rod-shaped extending downward from the circuit formation surface of the semiconductor chip 70. In the present example, the connection terminal 71 is columnar, for example. For example, the height of the connection terminal 71 may be approximately 10 to 20 μm. For example, the diameter of the connection terminal 71 may be approximately 20 to 30 μm. For example, the pitch of the connection terminal 71 may be approximately 40 to 50 μm. For example, copper or a copper alloy may be used as the material of the connection terminal 71. Other than a metal post, for example, a gold bump may be used as the connection terminal 71.

The joint member 72 is joined with the pad P1 and the connection terminal 71. For example, a layer of tin (Sn) or a lead (Pb)-free solder plating may be used as the joint member 72. For example, a lead-free solder, such as an Sn-silver (Ag) type, an Sn—Cu type, or an Sn—Ag—Cu type, may be used as the material of the solder plating. For example, the thickness of the joint member 72 may be approximately 5 to 15 μm.

A gap between the wiring substrate 10 and the semiconductor chip 70 is filled with the underfill resin 75. For example, an insulative resin, such as an epoxy resin, may be used as the material of the underfill resin 75.

The external connection terminal 76 is formed on the external connection pad P2 of the wiring substrate 10. The external connection terminal 76 is used to electrically connect to a pad arranged on a mount substrate, such as a motherboard (not illustrated). For example, a solder ball or a lead pin may be used as the external connection terminal 76. In the present example, a solder ball is used as the external connection terminal 76.

The operation of the wiring substrate 10 and the semiconductor package 60 will now be described.

The insulation layers 31 and 41 formed from the insulative resin including the reinforcement material are respectively formed on the lower surface 20B and the upper surface 20A of the core substrate 20. Consequently, even when the mechanical strength of the core substrate 20 decreases resulting from the reduced thickness of the core substrate 20, the mechanical strength of the insulation layers 31 and 41 may compensate for the decreased mechanical strength. This will be described below.

The through electrode 21 formed in the core substrate 20 has a diameter of approximately 100 to 200 μm. The via wires 33 and 42 formed in the insulation layers 31 and 41 including the reinforcement material has a diameter of approximately 50 to 70 μm. That is, the diameter of the via wires 33 and 42 is set to be smaller than that of the through electrode 21. Therefore, for example, when a number of the through electrodes 21 corresponding to the number of the via wires 33 (or, the via wires 42) are arranged, the amount of the glass cloth 31G of the insulation layer 31 (or, the glass cloth 41G of the insulation layer 41) that is split by the via wires 33 (or, the via wires 42) is less than the amount of the glass cloth 20G of the core substrate 20 that is split by the through electrodes 21. This ensures a large area that is covered by the glass clothes 20G, 31G, and 41G serving as the reinforcement material. Therefore, even when the thickness of the core substrate 20 is reduced and the insulation layers 31 and 41, which are thinner than the reduced thickness, are stacked on the lower surface 20B and the upper surface 20A of the core substrate 20, the glass clothes 31G and 41G of the insulation layers 31 and 41 sufficiently ensure the rigidity of the wiring substrate 10. This allows the overall thickness of the wiring substrate 10 to be reduced and limits the generation of warpage and undulation in the wiring substrate 10.

When warpage or undulation is generated in the wiring substrate 10, stress is applied to the boundary surface between the insulation layer 41, the main component of which is the thermosetting resin, and the insulation layer 51, the main component of which is the photosensitive resin. Under this condition, if the upper surface 41A of the insulation layer 41 is flat and smooth, the adhesion between the insulation layers 41 and 51 is weak. This easily separates the insulation layer 51 from the insulation layer 41 due to the stress. In contrast, the present example limits the generation of warpage or undulation in the wiring substrate 10. This limits the delamination of the insulation layer 51 from the insulation layer 41.

In the wiring substrate 10, the wiring structure 12, which includes the high-density wiring, is formed on one side of the wiring structure 11, and the solder resist layer 13 is formed on the other side of the wiring structure 11. That is, the wiring substrate 10 is asymmetric at the upper and lower sides of the wiring structure 11. Therefore, when the insulation layer 41 formed on the upper surface 20A of the core substrate 20 has the same thickness as the insulation layer 31 formed on the lower surface 20B of the core substrate 20, the arrangement of the wiring structure 12 causes different rigidity between an upper structure, which is arranged on the upper surface 20A of the core substrate 20, and a lower structure, which is arranged on the lower surface 20B of the core substrate 20. Namely, the upper structure, which includes the insulation layer 41, the via wire 42, and the wiring structure 12, has different rigidity from the lower structure, which includes the insulation layer 31, the wiring layer 32, the via wire 33, and the solder resist layer 13. The difference in rigidity causes the generation of warpage in the wiring substrate 10. Thus, when the insulation layers 31 and 41 have the same thickness, the surface, on which the semiconductor chip 70 is mounted, (here, upper surface) tends to warp in a downwardly curved manner due to the difference in rigidity between the upper structure and the lower structure. In the wiring substrate 10 of the present embodiment, the thickness of the insulation layer 41 is set to be smaller than that of the insulation layer 31 so that the upper structure has the rigidity close to that of the lower structure. As a result, the rigidity distribution of the wiring substrate 10 in the vertical direction (thicknesswise direction) is substantially symmetric at the portion above the core substrate 20 and the portion below the core substrate 20. Thus, the generation of warpage and undulation in the wiring substrate 10 may be limited in a further preferred manner.

In the insulation layer 41, the glass cloth 41G is located above the central position C1 of the insulation layer 41 in the thicknesswise direction. Further, the thickness T1 of the resin layer 43 is set to be smaller than the thickness T2 of the resin layer 44 so that the glass cloth 41G is arranged in the middle of the upper structure (insulation layer 41 and wiring structure 12) in the thicknesswise direction. This allows the glass cloth 41G having the high mechanical strength (rigidity) to be located in the middle of the upper structure in the thicknesswise direction. As a result, in the upper structure, the rigidity balance at the above portion of the glass cloth 41G and the below portion of the glass cloth 41G may be improved. This limits the generation of warpage and undulation in the wiring substrate 10 in a further preferred manner.

The method for manufacturing the wiring substrate 10 will now be described. Although a single wiring substrate 10 is enlarged in the description below, in the actual process, after manufacturing a batch of the wiring substrates 10 on one substrate, the substrate is fragmentized into individual wiring substrates 10.

Figure 3A:
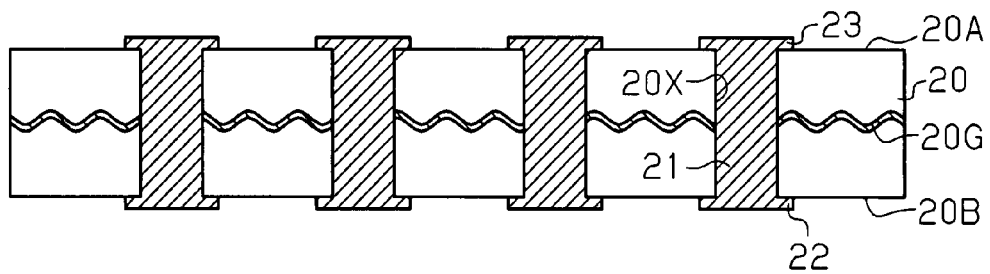
FIGS. 3A to 3C, 4A to 4C, 5A to 5C, 6A to 6C, 7A, 7B, 8A, 8B, 9A, 9B, and 10A are schematic cross-sectional views illustrating a method for manufacturing the wiring substrate of FIG. 1A, where

In the step illustrated in FIG. 3A, the through hole 20X is formed in, for example, a copper clad laminate (CCL) serving as the core substrate 20. Then, the through electrode 21 is formed in the through hole 20X by the electrolytic plating process or the paste filling process. The copper clad laminate may be formed, for example, by placing copper foils on both surfaces of a pre-preg and heating and pressurizing the pre-preg. The pre-preg is an adhesive sheet obtained by impregnating a thermosetting resin such as an epoxy resin in a glass cloth serving as the reinforcement material and processing to the B-stage state (partially cured state).

Next, the wiring layer 23 is formed on the upper surface 20A of the core substrate 20, for example, by the subtractive process. Also, the wiring layer 22 is formed on the lower surface 20B of the core substrate 20.

Figure 3B:
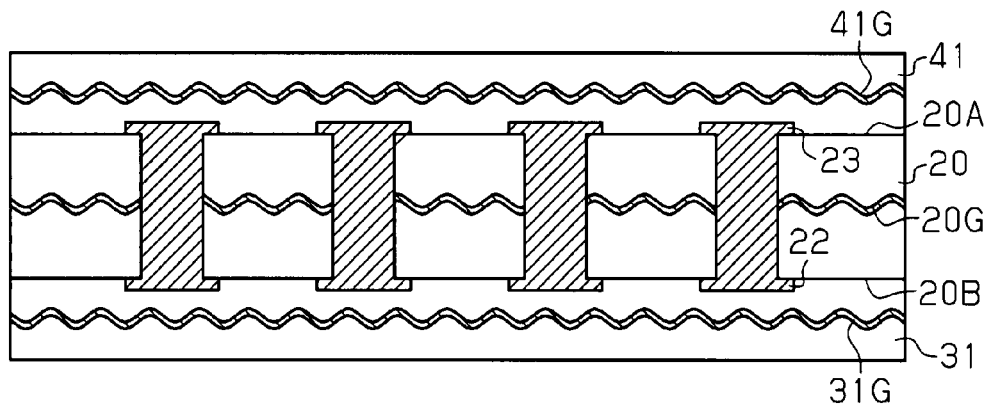
Figure 3C:
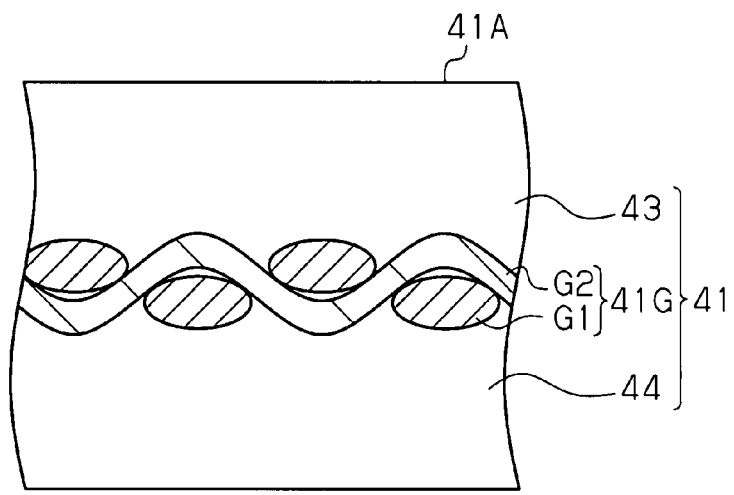

In the step illustrated in FIG. 3B, the insulation layer 31 is formed so that the lower surface 20B of the core substrate 20 and the wiring layer 23 are covered. Also, the insulation layer 41 is formed so that the upper surface 20A of the core substrate 20 and the wiring layer 23 are covered. The insulation layers 31 and 41 may be formed, for example, by, after stacking a resin film on the core substrate 20, heating the resin film to a temperature of approximately 130° C. to 200° C. while pressurizing the resin film to cure the resin film. The resin film is formed, for example, by impregnating a thermosetting resin such as an epoxy resin in a glass cloth serving as the reinforcement material. As illustrated in FIG. 3C, in the insulation layer 41, the upper surface of the glass cloth 41G is covered with the resin layer 43, and the lower surface of the glass cloth 41G is covered with the resin layer 44 having the same thickness as the resin layer 43. Therefore, the glass cloth 41G is located in the middle of the insulation layer 41 in the thicknesswise direction. For example, the thickness of the glass cloth 41G may be approximately 15 to 20 μm. Also, for example, the thickness from the upper surface of the glass cloth 41G to the upper surface of the resin layer 43 may be approximately 15 to 20 μm, and the thickness from the lower surface of the glass cloth 41G to the lower surface of the resin layer 44 may be approximately 15 to 20 μm.

In the same manner, in the insulation layer 31, the upper and lower surfaces of the glass cloth 31G are covered with the insulation layer 31. The glass cloth 31G is located in the middle of the insulation layer 31 in the thicknesswise direction. For example, the thickness of the insulation layer 41 is set to be substantially the same as that of the insulation layer 31. In this case, for example, the thickness of the insulation layers 31 and 41 may be approximately 40 to 75 μm.

Figure 4A:
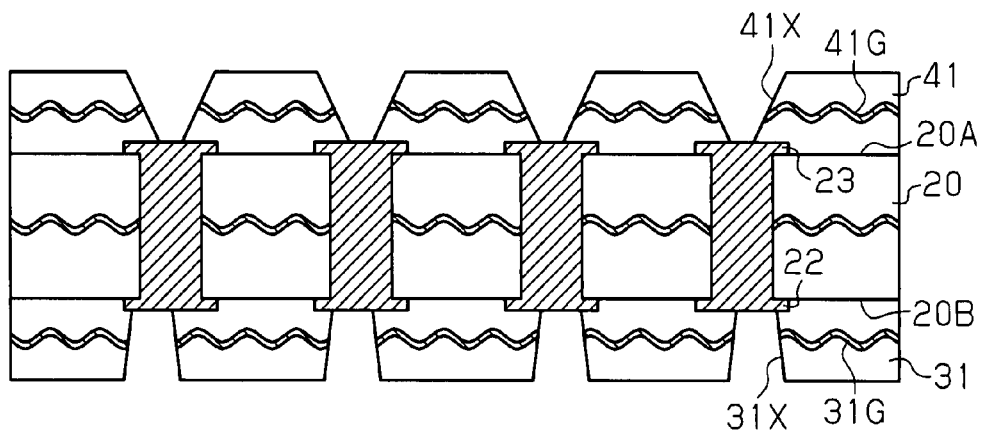
Figure 4B:
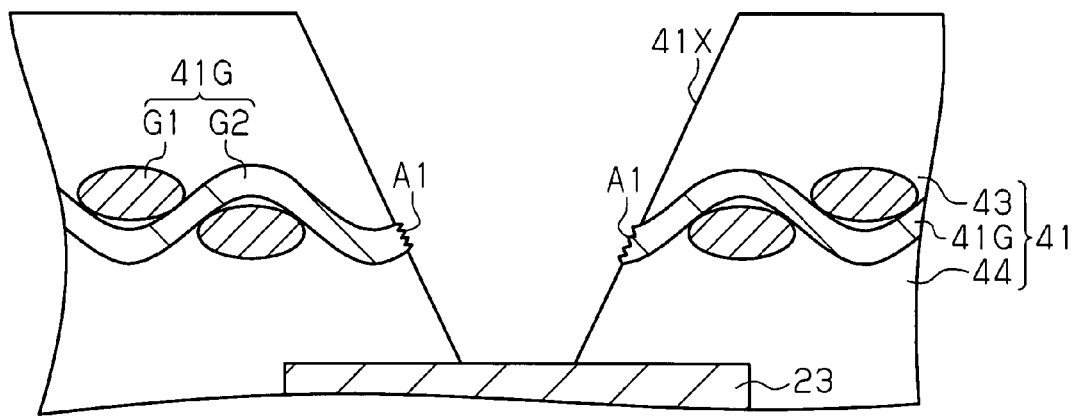

In the step illustrated in FIG. 4A, the through hole 31X is formed in a predetermined location of the insulation layer 31 so that a portion of the lower surface of the wiring layer 22 is exposed. Further, the through hole 41X is formed in a predetermined location of the insulation layer 41 so that a portion of the upper surface of the wiring layer 23 is exposed. The through holes 31X and 41X may be formed, for example, by a laser processing using such as a $CO_2$ laser or UV-YAG laser. As illustrated in FIG. 4B, when the through hole 41X is formed by the laser processing, the end portion A1 of the glass cloth 41G, which is cut by the laser, projects from the side wall of the through hole 41X toward the inner side of the through hole 41X. As a result, the end portion A1 of the glass cloth 41G has a greater surface roughness than that of the resin layers 43 and 44 forming the side wall of the through hole 41X. In the same manner, when the through hole 31X is formed by the laser processing, the end portion of the glass cloth 31G, which is cut by the laser, projects from the side wall of the through hole 31X toward the inner side of the through hole 31X.

Next, the desmear process is performed to remove resin smear from the surfaces of the wiring layers 22 and 23 exposed in the bottom portions of the through holes 31X and 41X. The desmear process roughens the side wall of the through hole 41X and the upper surface 41A of the insulation layer 41.

Figure 4C:
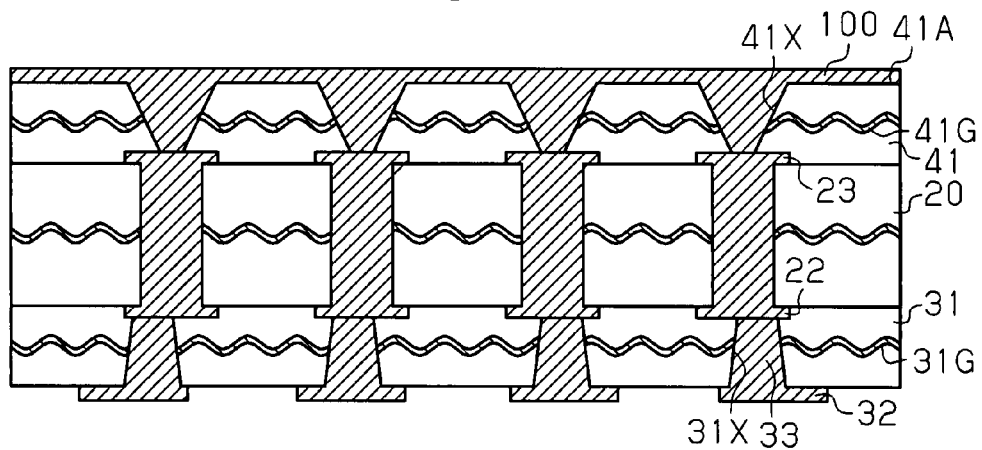

In the step in FIG. 4C, the via wire 33 is formed in the through hole 31X of the insulation layer 31. The wiring layer 32 is stacked on the insulation layer 31 so that the wiring layer 32 is electrically connected to the wiring layer 22 by the via wire 33. The via wire 33 and the wiring layer 32 may be formed, for example, using various wire formation processes, such as the semi-additive process and the subtractive process. By using such wire formation processes, the via wire 33 and the wiring layer 32 are formed from plating metal of, for example, copper or a copper alloy.

In the step illustrated in FIG. 4C, the seed layer (not illustrated) is formed to entirely cover the surface of the insulation layer 41 including the internal surface of the through hole 41X and the upper surface of the wiring layer 23 exposed in the through hole 41X. Then, the electrolytic plating is performed using the seed layer as a power supplying layer. For example, the seed layer is formed by the electroless copper plating process. Then, using the seed layer as the power supplying layer, the electrolytic plating process is performed. This forms a conductive layer 100, which fills the through hole 41X and entirely covers the upper surface 41A of the insulation layer 41.

Figure 5A:
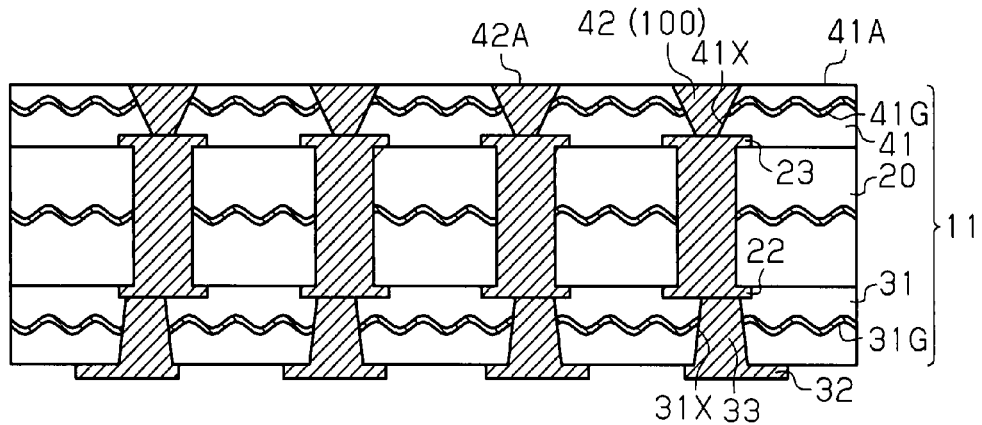
Figure 5B:
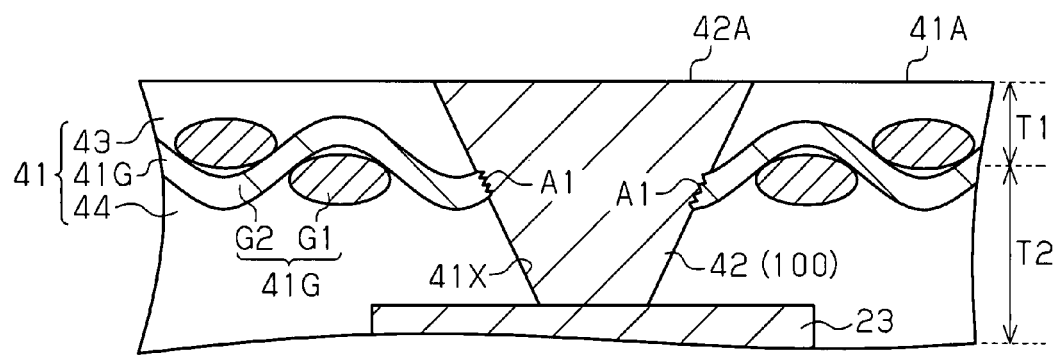

In the step illustrated in FIG. 5A, the conductive layer 100, which projects from the upper surface 41A of the insulation layer 41, is polished, for example, by the chemical mechanical polishing (CMP) process. Further, a portion of the upper surface 41A of the insulation layer 41 having a rough surface is polished by the CMP process. This forms the via wire 42, which fills the through hole 41X. The upper end surface 42A of the via wire 42 is substantially flush with the upper surface 41A of the insulation layer 41. In this case, as illustrated in FIG. 5B, the via wire 42 entirely covers the end portion A1 of the glass cloth 41G projected from the side wall of the through hole 41X. In other words, the end portion A1 of the glass cloth 41G, which projects from the side wall of the through hole 41X, projects into the via wire 42.

In the step illustrated in FIG. 5A, the upper surface 41A of the insulation layer 41 becomes flat and smooth by polishing a portion of the upper surface 41A of the insulation layer 41 using the CMP process. For example, the upper surface 41A of the insulation layer 41 has a surface roughness Ra value of approximately 300 to 400 nm before being polished. The upper surface 41A of the insulation layer 41 may have a surface roughness Ra value of approximately 15 to 40 nm after being polished. The internal surface of the through hole 41X remains rough. Thus, the upper surface 41A of the insulation layer 41 has a lower surface roughness than the internal surface of the through hole 41X.

By polishing a portion of the upper surface 41A of the insulation layer 41 as described above, the thickness of the insulation layer 41 becomes smaller than that of the insulation layer 31 (refer to FIG. 5A). In the present embodiment, by polishing a portion of the upper surface 41A of the insulation layer 41, the thickness of the resin layer 43 covering the upper surface of the glass cloth 41G is reduced. Thus, the thickness T1 of the resin layer 43 becomes smaller than the thickness T2 of the resin layer 44 covering the lower surface of the glass cloth 41G. This locates the glass cloth 41G, which is located in the middle of the insulation layer 41 in the thicknesswise direction before being polished, in a position toward an upper side from the centerline of the insulation layer 41 in the thicknesswise direction. In this step, the insulation layer 41 is polished so that the glass cloth 41G is not exposed on the resin layer 43.

For example, the removed amount of the insulation layer 41 may be approximately 5 to 7 μm. Thus, for example, after being polished, the thickness of the insulation layer 41 may be approximately 35 to 70 μm, the thickness T1 of the resin layer 43 may be approximately 15 to 35 μm, and the thickness T2 of the resin layer 44 may be approximately 20 to 40 μm. For example, the thickness from the upper surface of the glass cloth 41G to the upper surface of the resin layer 43 may be approximately 10 to 15 µm.

In this case, the removed amount of the insulation layer 41 is greater than, for example, when the upper surface 41A is polished just to obtain a flat and smooth surface on the upper surface 41A of the insulation layer 41. This inhibits the seed layer used in the electrolytic plating process from remaining on the upper surface 41A of the insulation layer 41 after being polished. Thus, there is no need to perform an etching process to remove the seed layer from the upper surface 41A of the insulation layer 41 after being polished. The etching process removes the seed layer from the upper surface 41A of the insulation layer 41 and also removes the seed layer covering the internal surface of the through hole 41X. This would form a gap between an outer side surface of the via wire 42 and the internal surface of the through hole 41X. However, in the manufacturing method of the present embodiment, the etching process may be omitted. This limits the formation of a gap between the outer side surface of the via wire 42 and the internal surface of the through hole 41X.

In the CMP process of the present example, when polishing the conductive layer 100 formed on the upper surface 41A of the insulation layer 41, the material of a slurry, the hardness of a polishing pad, and the like are adjusted so that the polished amount of the conductive layer 100 (metal) is greater than that of the insulation layer 41 (resin). Additionally, in the CMP process of the present example, after the upper surface 41A of the insulation layer 41 is exposed, the material of the slurry, the hardness of the polishing pad, and the like are changed. For example, after the upper surface 41A of the insulation layer 41 is exposed, the material of the slurry, the hardness of the polishing pad, and the like are adjusted so that the polished amount of the insulation layer 41 (resin) is greater than that of the conductive layer 100 (metal). Through the manufacturing procedures, the wiring structure 11 may be manufactured.

Figure 5C:
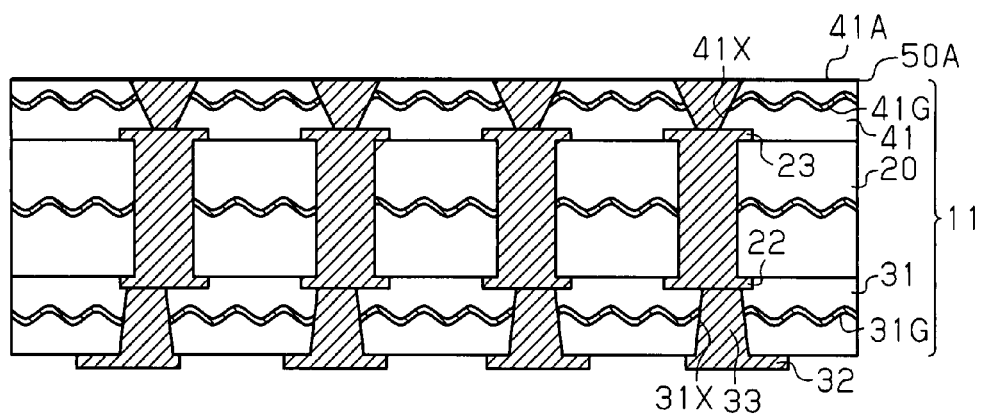

In the step illustrated in FIG. 5C, the seed layer 50A is formed so that the upper surface 41A of the insulation layer 41 and the upper end surface 42A of the via wire 42 are entirely covered. The seed layer 50A may be formed, for example, by using the sputtering process or the electroless plating process. The upper surface 41A of the insulation layer 41 is flat and smooth. Thus, the seed layer 50A may be evenly formed on the upper surface 41A of the insulation layer 41 by the sputtering process. Consequently, the seed layer 50A may have a flat and smooth upper surface. Also, in this case, the seed layer 50A is thinner than when forming the seed layer 50A on a rough surface by the sputtering process. In the present example, first, a layer of titanium (Ti) is deposited on the upper surface 41A of the insulation layer 41 and the upper end surface 42A of the via wire 42 by sputtering to cover the upper surface 41A and the upper end surface 42A. Then, a layer of copper (Cu) is deposited on the layer of Ti by sputtering. This forms the seed layer 50A having a two-layer structure (layer of Ti/layer of Cu). The formation of the layer of Ti as a lower layer of the seed layer 50A improves the adhesion between the insulation layer 41 and the seed layer 50A. The layer of Ti may be changed to a layer of TiN formed from titanium nitride (TiN) so that the seed layer 50A is formed by a two-layer structure having the layer of TiN and the layer of Cu. Titanium and titanium nitride are metal having a higher corrosion resistance than copper. When the electroless plating process is used, for example, the seed layer 50A may be formed by the layer of Cu (one-layer structure) by performing the electroless copper plating.

Before forming the seed layer 50A, a plasma treatment such as an $O_2$ plasma ashing may be performed on the upper surface 41A of the insulation layer 41. The plasma treatment roughens the upper surface 41A of the insulation layer 41. The rough upper surface 41A of the insulation layer 41 improves the adhesion between the seed layer 50A and the insulation layer 41. Contrarily, fine wires may be formed on the upper surface 41A when the surface roughness of the upper surface 41A of the insulation layer 41 is decreased to improve the smoothness. Therefore, in the plasma treatment, the upper surface 41A of the insulation layer 41 is roughened to a degree that does not affect the formation of fine wires in a subsequent step.

Figure 6A:
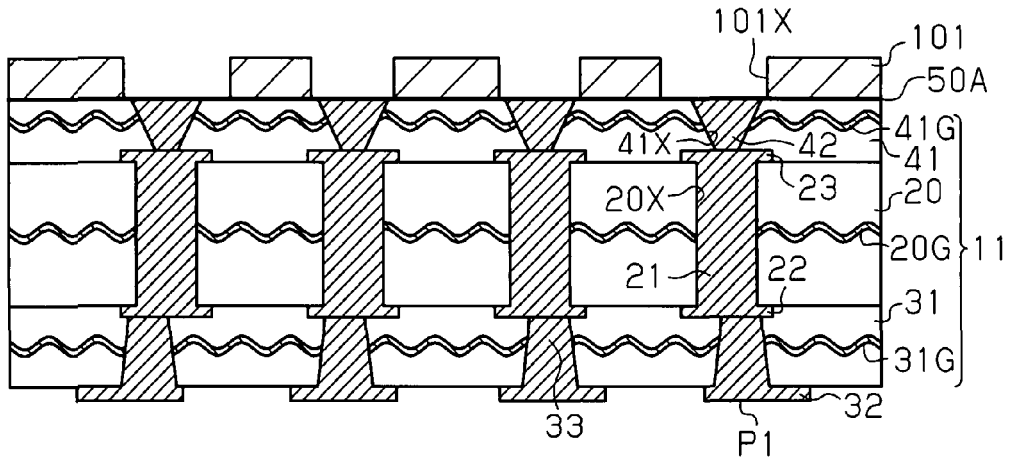

In the step illustrated in FIG. 6A, a resist layer 101, which includes an opening pattern 101X in a predetermined location, is formed on the seed layer 50A. The opening pattern 101X exposes the seed layer 50A on a location corresponding to the region where the wiring layer 50 is formed (refer to FIG. 1). As the material of the resist layer 101, for example, a material having a plating resistance against the plating process performed in the next step may be used. For example, a photosensitive dry film resist or a liquid photoresist may be used as the material of the resist layer 101. As the material of such resists, for example, a novolak resin or acryl resin may be used. For example, when a photosensitive dry film resist is used, a dry film is stacked on the upper surface of the seed layer 50A and undergoes a thermal press fitting, and the dry film is patterned by a photolithography. This forms the resist layer 101 including the opening pattern 101X. When a liquid photoresist is used, the resist layer 101 may be formed through the same process. In this process, the upper surface of the seed layer 50A is flat and smooth. This limits the generation of a defective pattern in the resist layer 101 formed on the seed layer 50A. That is, the opening pattern 101X may be formed in the resist layer 101 in a highly accurate manner.

Figure 6B:
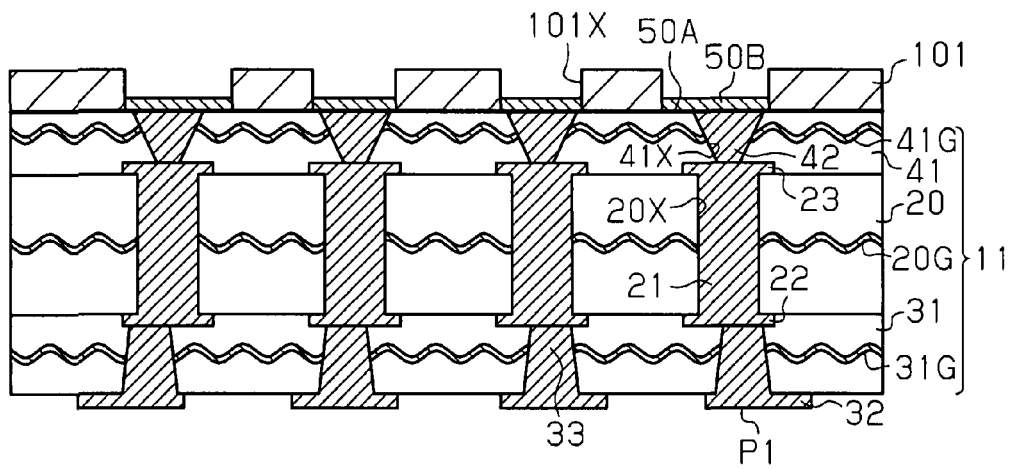

In the step illustrated in FIG. 6B, the electrolytic plating is performed by using the resist layer 101 as a plating mask and the seed layer 50A as the plating power supplying layer. For example, by performing the electrolytic copper plating, an electrolytic copper plating metal layer is formed on the upper surface of the seed layer 50A and serves as the metal layer 50B.

Figure 6C:
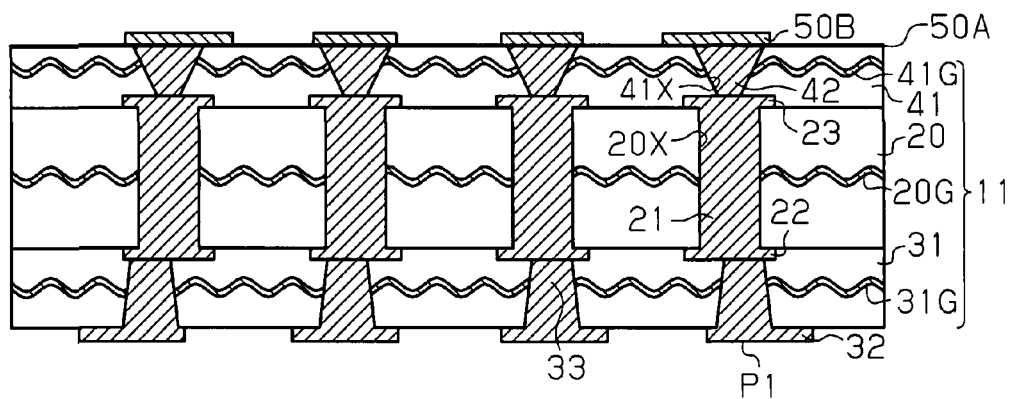

In the step illustrated in FIG. 6C, the resist layer 101 illustrated in FIG. 6B is removed, for example, using an alkaline dissociation solution.

Figure 7A:
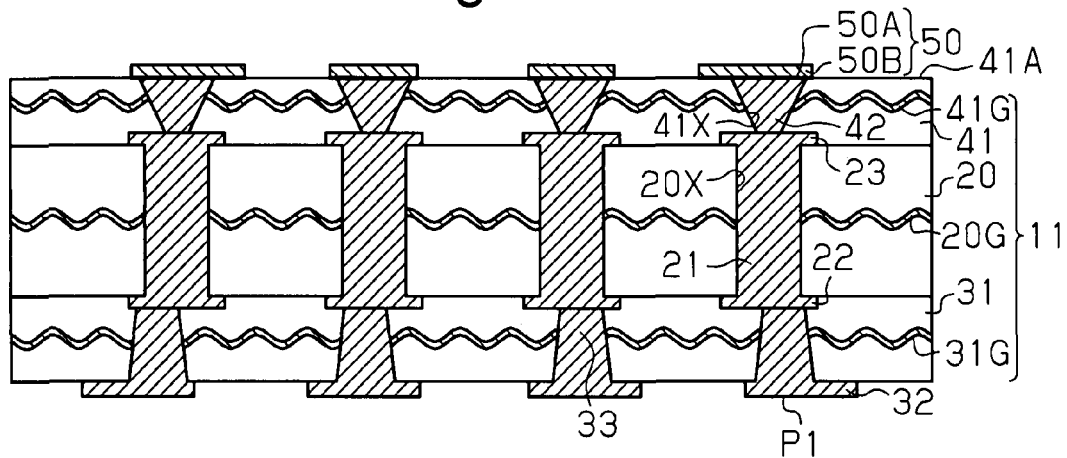
Figure 7B:
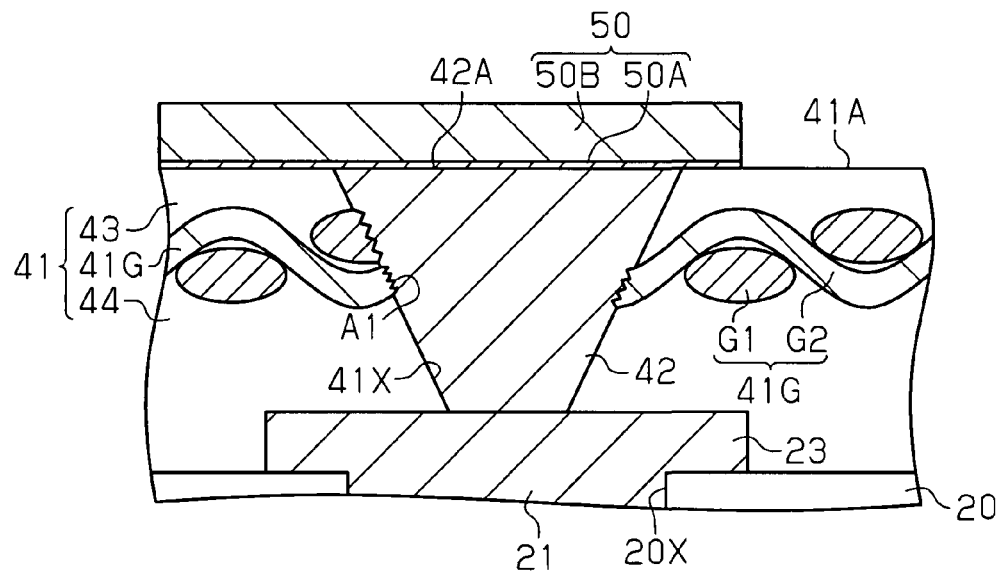

In the step illustrated in FIG. 7A, an unnecessary portion of the seed layer 50A is removed by etching using the metal layer 50B as an etching mask. This forms the wiring layer 50 on the upper end surface 42A of the via wire 42 and the upper surface 41A of the insulation layer 41 as illustrated in FIG. 7B. The wiring layer 50 is formed by the seed layer 50A, which is joined with the upper end surface 42A of the via wire 42, and the metal layer 50B formed on the seed layer 50A. In this manner, the wiring layer 50 is formed by the semi-additive process. The wiring layer 50 and the via wire 42 are formed in different steps. Thus, the wiring layer 50 and the via wire 42 are not integrally formed.

Figure 8A:
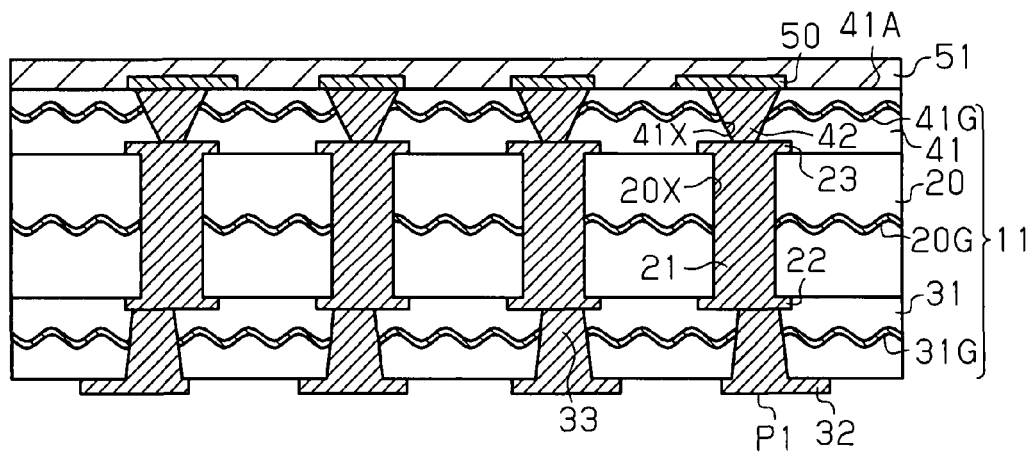

In the step illustrated in FIG. 8A, the insulation layer 51 is formed on the upper surface 41A of the insulation layer 41 so that the surfaces (upper and side surfaces) of the wiring layer 50 are entirely covered. For example, the insulation layer 51 may be formed by stacking a resin film on the upper surface 41A of the insulation layer 41 and performing the thermal press fitting. In this step, by stacking the resin film under a vacuum atmosphere, the formation of a void may be avoided. For example, a photosensitive resin film, such as a phenol resin or a polyimide resin, may be used as the resin film. Instead of the resin film, the insulation layer 51 may be formed by applying a liquid or paste-like insulative resin to the upper surface 41A of the insulation layer 41 by the spin coating process or the like. As the liquid or paste-like insulative resin, for example, a photosensitive resin, such as a phenol resin or a polyimide resin, may be used.

Figure 8B:
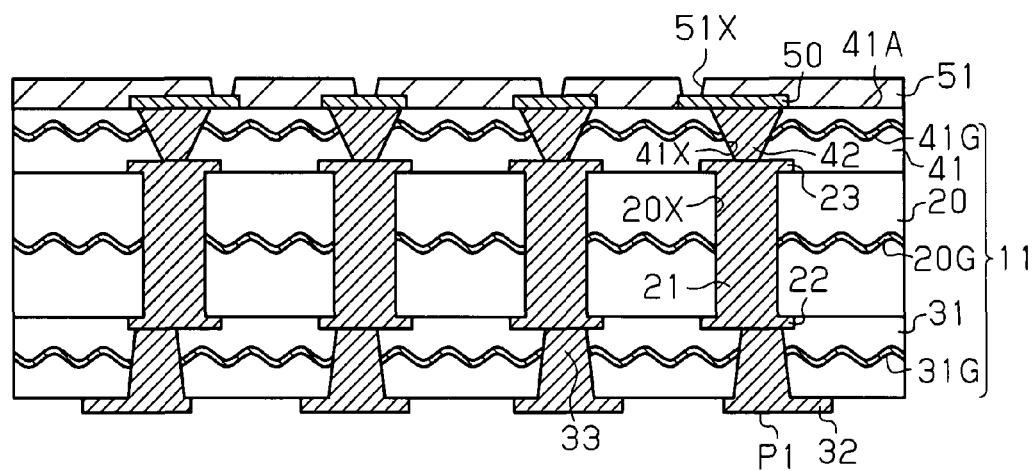

In the step illustrated in FIG. 8B, the through hole 51X may be formed in a predetermined location of the insulation layer 51, for example, by the photolithography process. The through hole 51X extends through the insulation layer 51 in the thicknesswise direction and exposes the upper surface of the wiring layer 50. The upper surface of the insulation layer 51 formed from a photosensitive resin may have a surface roughness Ra value of approximately 2 to 10 nm. That is, the upper surface of the insulation layer 51 has a lower surface roughness than the internal surface of the through hole 41X and the upper surface 41A of the insulation layer 41.

Figure 9A:
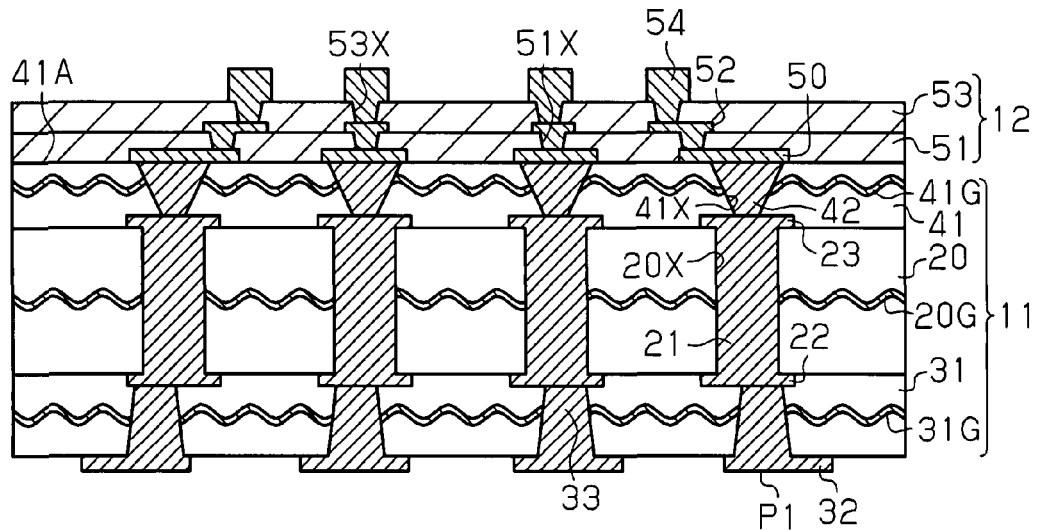
Figure 9B:
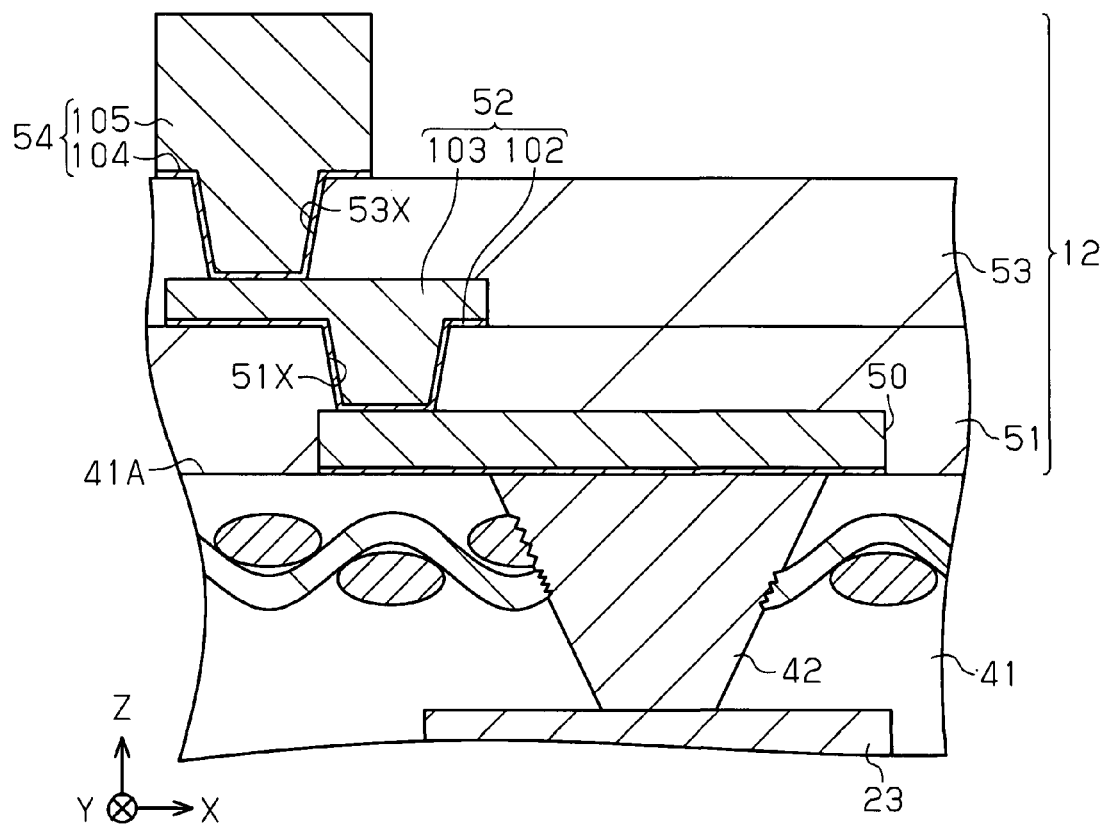

In the step illustrated in FIG. 9A, the wiring layer 52 may be formed, for example, by the semi-additive process in the same manner as the steps illustrated in FIGS. 50 to 7B. The wiring layer. 52 includes a via wire, which fills the through hole 51X, and a wiring pattern, which is stacked on the upper surface of the insulation layer 51 and electrically connected to the wiring layer 50 by the via wire. More specifically, as illustrated in FIG. 9B, the wiring layer 52 includes a seed layer 102, which entirely covers the internal surface of the through hole 51X and covers the upper surface of the insulation layer 51 located around the through hole 51X, and an electrolytic copper plating layer 103 located on the seed layer 102.

In the same manner as the steps in FIGS. 8A and 8B, the insulation layer 53 is formed on the insulation layer 51. The insulation layer 53 includes the through hole 53X, which exposes a portion of the upper surface of the wiring layer 52. Then, in the same manner as the steps in FIGS. 50 to 7B, the wiring layer 54 is formed, for example, by the semi-additive process. The wiring layer 54 includes a via wire, which fills the through hole 53X, and the pad P1 (refer to FIG. 1), which is stacked on the upper surface of the insulation layer 53 and electrically connected to the wiring layer 52 by the via wire. More specifically, the wiring layer 54 includes a seed layer 104, which entirely covers the internal surface of the through hole 53X and covers the upper surface of the insulation layer 53 located around the through hole 53X, and an electrolytic copper plating layer 105 located on the seed layer 104. If necessary, a surface-processed layer may be formed on the surface of the pad P1 of the wiring layer 54. Through the manufacturing procedures, the wiring structure 12 may be stacked on the upper surface 41A of the uppermost insulation layer 41 of the wiring structure 11.

Figure 10A:
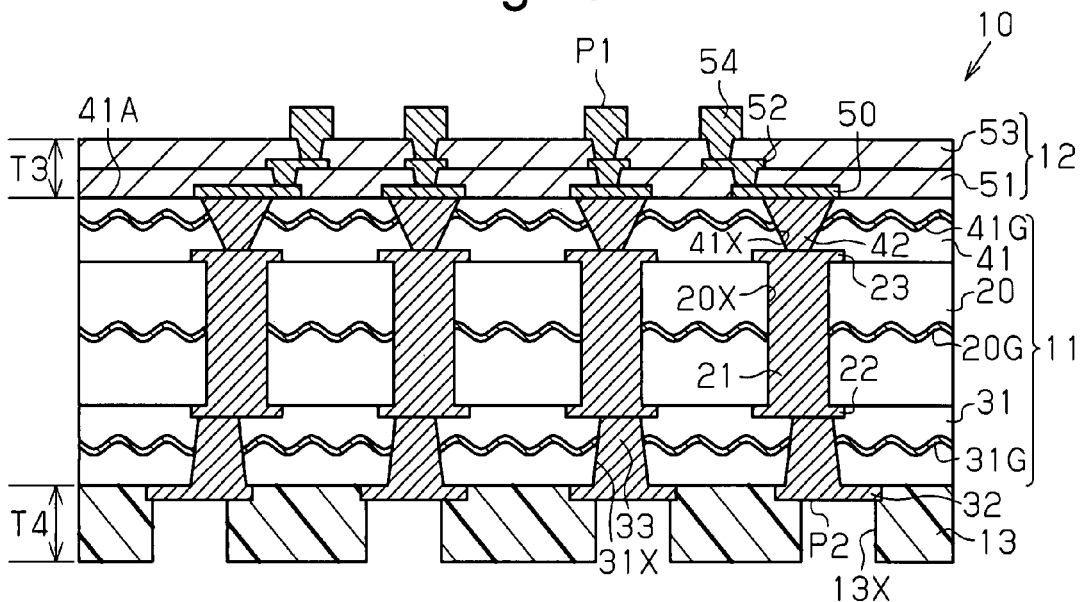

In the step illustrated in FIG. 10A, the solder resist layer 13 is stacked on the lower surface of the insulation layer 31. The solder resist layer 13 includes an opening 13X, which exposes the external connection pad P2 in a predetermined location of the lowermost wiring layer 32 of the wiring structure 11. In this case, the thickness T4 of the solder resist layer 13 (thickness from the lower surface of the insulation layer 31 to the lower surface of the solder resist layer 13) is set to be greater than or equal to the thickness T3 of the wiring structure 12 (thickness from the upper surface 41A of the insulation layer 41 to the upper surface of the insulation layer 53). The solder resist layer 13 may be formed, for example, by stacking a photosensitive solder resist film on the lower surface of the insulation layer 31 or applying a liquid solder resist and pattering the resist into a desirable shape. By the patterning, a portion of the wiring layer 32 is exposed in the opening 13X of the solder resist layer 13 and serves as the external connection pad P2.

If necessary, a surface-processed layer may be formed on the wiring layer 32 exposed in the opening 13X of the solder resist layer 13 (i.e., external connection pad P2). Through the manufacturing procedures, the wiring substrate 10 illustrated in FIG. 1A may be manufactured.

The method for manufacturing the semiconductor package 60 will now be described.

Figure 10B:
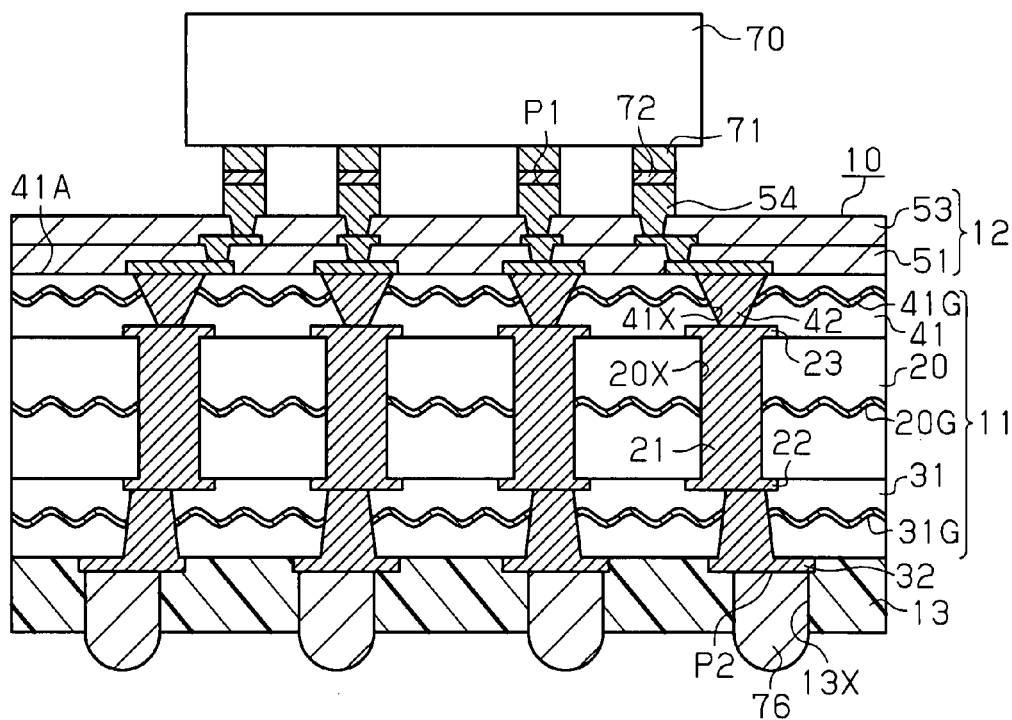
FIG. 10B is a schematic cross-sectional view illustrating a method for manufacturing the semiconductor device of FIG. 2.

In the step illustrated in FIG. 10B, the external connection terminal 76 is formed on the external connection pad P2. For example, after appropriately applying flux to the external connection pad P2, the flux is joined with the external connection terminal 76 (here, solder ball). Then, the external connection terminal 76 is fixed to the external connection pad P2 by performing reflow soldering at approximately 240° C. to 260° C. Subsequently, the unnecessary flux is removed by a surface cleaning process.

Also, in the step illustrated in FIG. 10B, the semiconductor chip 70 including the rod-shaped connection terminal 71 is prepared. The connection terminal 71 may be manufactured through a known manufacturing method, which will not be illustrated in the drawings and described in detail. The connection terminal 71 is manufactured, for example, through the following process.

First, for example, a protection film is formed on the circuit formation surface of the semiconductor chip 70 (here, lower surface). The protection film includes an opening, which exposes an electrode pad. Next, a seed layer is formed so that the lower surfaces of the protection film and the electrode pad are covered. A resist layer is formed so that the seed layer is exposed on a location corresponding to the region where the connection terminal 71 is formed. Then, the electrolytic plating (for example, electrolytic copper plating) is performed using the seed layer exposed on the resist layer as the power supplying layer. This forms the rod-shaped connection terminal 71 on the electrode pad.

The joint member 72 is formed on the lower surface of the connection terminal 71. The joint member 72 may be formed, for example, by applying solder to the lower surface of the connection terminal 71 by the electrolytic solder plating, which uses the resist layer formed on the seed layer as the plating mask and the seed layer as the plating power supplying layer. Subsequently, the unnecessary seed layer and resist layer are removed.

The connection terminal 71 of the semiconductor chip 70 is flip-chip-joined with the pad P1 (wiring layer 54) of the wiring substrate 10. For example, after the wiring substrate 10 and the semiconductor chip 70 are positioned, a reflow process is performed to melt the joint member 72 (solder plating layer). This electrically connects the connection terminal 71 to the pad P1.

Figure 2:
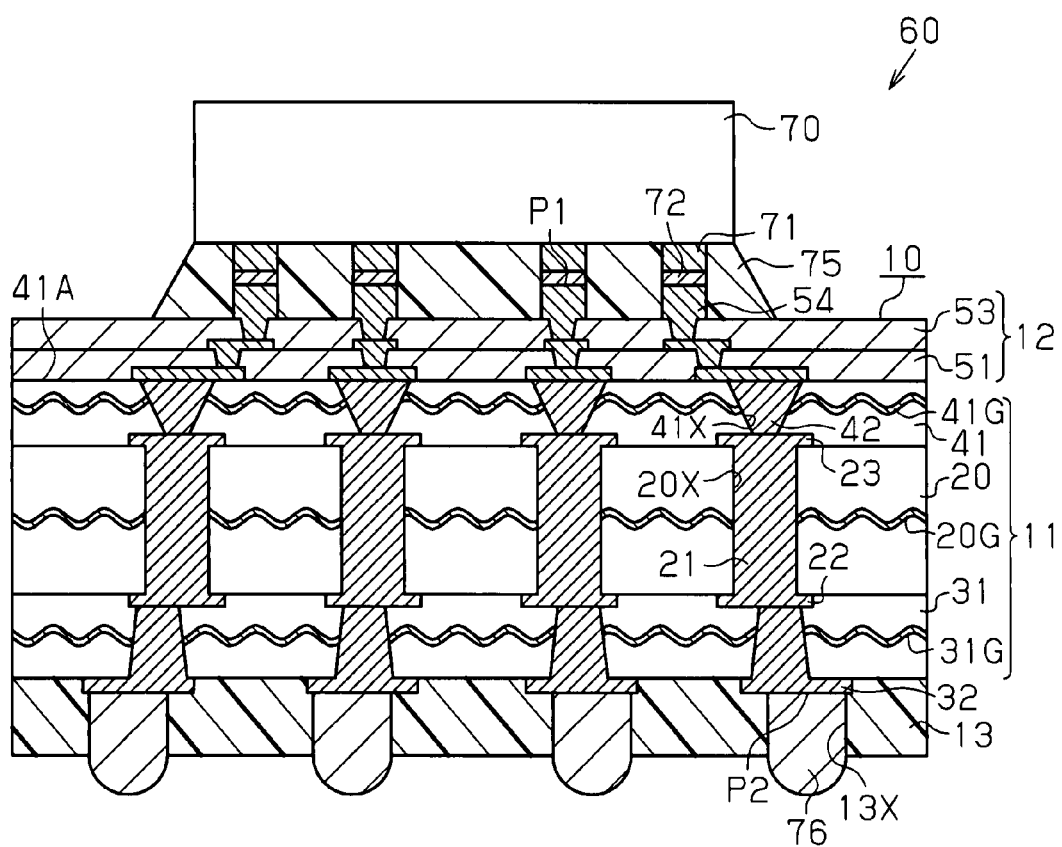
FIG. 2 is a schematic cross-sectional view illustrating a semiconductor device including the wiring substrate of FIG. 1A.

A gap between the semiconductor chip 70 and the wiring substrate 10, which are flip-chip-joined, is filled with the underfill resin 75 (refer to FIG. 2). Then, the underfill resin 75 is cured. Through the manufacturing procedures, the semiconductor package 60 illustrated in FIG. 2 may be manufactured.

The first embodiment has the advantages described below.

(1) The insulation layers 31 and 41 formed from the insulative resin including the reinforcement material are located on the lower surface 20B and the upper surface 20A of the core substrate 20. This sufficiently ensures the rigidity of the wiring substrate 10 even when the thickness of the core substrate 20 is reduced and the insulation layers 31 and 41, which are thinner than the reduced thickness, are stacked on the lower surface 20B and the upper surface 20A of the core substrate 20. Thus, the overall thickness of the wiring substrate 10 may be reduced, and the generation of warpage and undulation may be limited in the wiring substrate 10.

(2) The generation of warpage and undulation is limited in the wiring substrate 10. This limits the delamination of the insulation layer 51 from the insulation layer 41.

(3) The thickness of the insulation layer 41 is set to be smaller than that of the insulation layer 31. This allows the upper structure formed on the upper surface 20A of the core substrate 20 (i.e., insulation layer 41, via wire 42, and wiring structure 12) to have the rigidity close to that of the lower structure formed on the lower surface 20B of the core substrate 20 (i.e., insulation layer 31, wiring layer 32, via wire 33, and solder resist layer 13). As a result, the rigidity distribution of the wiring substrate 10 in the vertical direction (thicknesswise direction) is substantially symmetric at the portion above the core substrate 20 and the portion below the core substrate 20. This limits the generation of warpage and undulation in the wiring substrate 10 in a further preferred manner.

(4) The glass cloth 41G is located above the central position C1 of the insulation layer 41 in the thicknesswise direction. The thickness T1 of the resin layer 43 is set to be smaller than the thickness T2 of the resin layer 44 so that the glass cloth 41G is arranged in the middle of the upper structure (insulation layer 41 and wiring structure 12) in the thicknesswise direction. This allows the glass cloth 41G having the high mechanical strength (rigidity) to be located in the middle of the upper structure in the thicknesswise direction. As a result, in the upper structure, the rigidity balance at the above portion of the glass cloth 41G and the below portion of the glass cloth 41G may be improved. This limits the generation of warpage and undulation in the wiring substrate 10 in a further preferred manner.

(5) The thickness T4 of the solder resist layer 13 is set to be greater than or equal to the thickness T3 of all of the layers of the wiring structure 12. Consequently, the wiring substrate 10 may have the physical property distribution in the vertical direction (thicknesswise direction) that is substantially symmetric at the portion above the core substrate 20 and the portion below the core substrate 20. This improves the balance of the physical properties at the above portion of the core substrate 20 and the below portion of the core substrate 20 and limits the generation of warpage and undulation in the wiring substrate 10 resulting from thermal shrinkage or the like.

(6) The upper surface 41A of the insulation layer 41 is smoother than the internal surface of the through hole 41X of the insulation layer 41. This allows a metal film (for example, seed layer 50A) to be evenly formed on the upper surface 41A of the insulation layer 41, for example, by the sputtering process. Additionally, the seed layer 50A may be thinner than when the seed layer 50A is formed on a rough surface. The upper surface 41A of the insulation layer 41 is flat and smooth including a few irregularities. Thus, the generation of residue may be limited when the seed layer 50A is removed by etching as compared to when the upper surface 41A of the insulation layer 41 is rough including many irregularities. This easily copes with the finer wiring layer even when the wiring layer stacked on the upper surface 41A of the insulation layer 41 is further reduced in size.

(7) The via wire 42 entirely covers the end portion A1 of the glass cloth 41G projected from the side wall of the through hole 41X toward the inner side of the through hole 41X. In other words, the end portion A1 of the glass cloth 41G projects to the via wire 42. This increases the tensile strength of the via wire 42 and improves the connection reliability between the via wire 42 and the insulation layer 41.

(8) The through hole 41X arranged in the insulation layer 41 has the rough internal surface. This increases the contacting area between the via wire 42 and the insulation layer 41 as compared to when the through hole 41X has a flat and smooth internal surface. Thus, the adhesion may be improved between the via wire 42 and the insulation layer 41. This limits the delamination of the via wire 42 and the insulation layer 41 resulting from the difference in linear expansion coefficient and improves the connection reliability between the via wire 42 and the insulation layer 41.

Second Embodiment

A second embodiment will now be described with reference to FIGS. 11 to 18. Like or same reference numerals are given to those components that are the same as the corresponding components illustrated in FIGS. 1A to 10B. Such components will not be described in detail.

Figure 11:
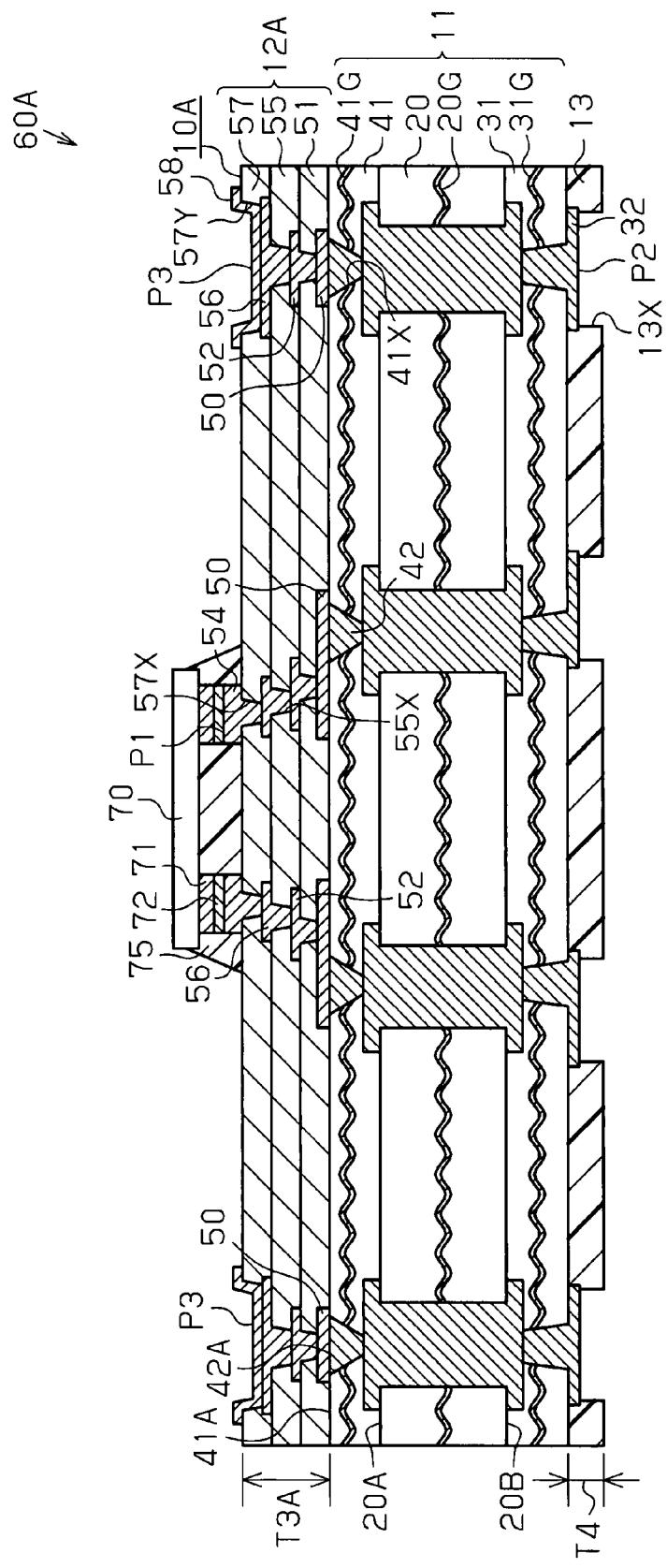
FIG. 11 is a schematic cross-sectional view illustrating a semiconductor package including a wiring substrate of a second embodiment.

As illustrated in FIG. 11, the semiconductor device 60A (semiconductor package) includes a wiring substrate 10A, the semiconductor chip 70 mounted on the wiring substrate 10A, and the underfill resin 75 formed in the gap between the wiring substrate 10A and the semiconductor chip 70.

The wiring substrate 10A includes the wiring structure 11, a wiring structure 12A stacked on one side of the wiring structure 11 (here, upper side), and the solder resist layer 13 stacked on the other side of the wiring structure (here, lower side). The wiring substrate 10A may have any shape and size as viewed from above. For example, the surface of the wiring substrate 10A may be square with sides of approximately 10 mm.

In the wiring structure 11, in the same manner as the first embodiment, the insulation layers 41 and 31 including the reinforcement material are respectively stacked on the upper surface 20A and the lower surface 20B of the core substrate 20. In the insulation layer 41 formed on the upper surface 20A of the core substrate 20, the glass cloth 41G is located upper than the centerline of the insulation layer 41 in the thicknesswise direction.

The wiring structure 12A includes the wiring layer 50, the insulation layer 51, the wiring layer 52, an insulation layer 55, a wiring layer 56, an insulation layer 57, and the uppermost wiring layers 54 and 58, which are sequentially stacked on the insulation layer 41. The thickness T3A of the wiring structure 12A corresponds to the total thickness of all of the insulation layers 51, 55, and 57 of the wiring structure 12A. That is, the thickness T3A corresponds to the thickness from the upper surface 41A of the insulation layer 41 to the upper surface of the insulation layer 57. For example, the thickness T3A may be approximately 20 to 40 μm. The thickness T3A of the wiring structure 12A is set to be smaller than or equal to the thickness T4 of the solder resist layer 13. In FIG. 11, the thickness T3A of the wiring structure 12A is greater than the thickness T4 of the solder resist layer 13 so that the structure of the wiring structure 12A is easily understood.

For example, copper or a copper alloy may be used as the material of the wiring layers 56 and 58. For example, a photosensitive insulative resin, the main component of which is a phenol resin or a polyimide resin, may be used as the material of the insulation layers 55 and 57. For example, the insulation layers 55 and 57 may include a filler such as silica or alumina.

The wiring layers 56 and 58 are each thinner than the wiring layer of the wiring structure 11. For example, the thickness of the wiring layers 56 and 58 formed on the insulation layers 55 and 57 may be each approximately 1 to 3 μm. For example, the L/S of the wiring layer 56 may be approximately 2 μm/2 μm. The insulation layers 55 and 57 are each thinner than the insulation layer of the wiring structure 11.

For example, the thickness of the insulation layers 55 and 57 may be approximately 5 to 10 μm.

The wiring layer 50 is stacked on the upper surface 41A of the insulation layer 41 to connect the upper end surface 42A of the via wire 42. The insulation layer 51 is formed on the upper surface 41A of the insulation layer 41 to cover the wiring layer 50. The wiring layer 52 is stacked on the upper surface of the insulation layer 51.

The insulation layer 55 is formed on the upper surface of the insulation layer 51 to cover the wiring layer 52. A through hole 55X is formed in a predetermined location of the insulation layer 55. The through hole 55X extends through the insulation layer 55 in the thicknesswise direction and exposes a portion of the upper surface of the wiring layer 52. The through hole 55X is tapered such that the diameter reduces from the upper side (wiring layers 54 and 58) toward the lower side (wiring structure 11) in FIG. 11. For example, the through hole 55X has an inverted truncated circular cone shape such that the upper open end has an opening diameter greater than an opening diameter of the lower open end. For example, the opening diameter of the upper open end of the through hole 55X may be approximately 10 to 20 μm.

The wiring layer 56 is stacked on the upper surface of the insulation layer 55. The wiring layer 56 is electrically connected to the wiring layer 52. The wiring layer 56 includes a via wire, which fills the through hole 55X, and a wiring pattern, which is formed on the upper surface of the insulation layer 55.

The insulation layer 57 is formed on the upper surface of the insulation layer 55 to cover the wiring layer 56. The through holes 57X and 57Y are formed in predetermined locations of the insulation layer 57. The through holes 57X and 57Y extend through the insulation layer 57 in the thicknesswise direction and expose portions of the upper surface of the wiring layer 56. The through hole 57Y is located in an outer region from the through hole 57X. The through holes 57X and 57Y are each tapered such that the diameter reduces from the upper side (wiring layers 54 and 58) toward the lower side (wiring structure 11) in FIG. 11. For example, the through holes 57X and 57Y each have an inverted truncated circular cone shape such that the upper open end has an opening diameter greater than an opening diameter of the lower open end.

The aspect ratio of the through hole 57Y is set to be smaller than that of the through hole 57X. That is, the opening diameter of the through hole 57Y is set to be larger than that of the through hole 57X. For example, the upper open end of the through hole 57X has an opening diameter of approximately 10 to 20 μm. For example, the upper open end of the through hole 57Y may have an opening diameter of approximately 100 to 150 μm. For example, the through holes 57X and 57Y each may have a depth of approximately 1 to 3 μm. For example, the through hole 57X may have an aspect ratio of approximately 0.05 to 0.1, and the through hole 57Y may have an aspect ratio of approximately 0.01 to 0.02. For example, the aspect ratio of the through hole 57Y is set to be 0.2 to 0.4 times greater than that of the through hole 57X.

The uppermost wiring layers 54 and 58 are stacked on the upper surface of the insulation layer 57. The wiring layers 54 and 58 are electrically connected to the wiring layer 56.

The wiring layer 54 includes a via wire, which fills the through hole 57X having the large aspect ratio, and the projected pad P1, which projects upward from the upper surfaces of the via wire and the insulation layer 57. The pad P1 is a rod-shaped metal post extending upward from the upper surface of the insulation layer 57. The pad P1 of the present example is columnar, for example. For example, the pad P1 may have a diameter of approximately 20 to 30 μm and a pitch of approximately 40 to 50 μm.

The wiring layer 58 is formed along the internal surface and the bottom surface of the through hole 57Y having the small aspect ratio and extends on the upper surface of the insulation layer 57. The wiring layer 58 entirely covers the internal surface of the through hole 57Y and the bottom surface of the through hole 57Y (i.e., entire upper surface of the wiring layer 56 exposed in the through hole 57Y) and covers the upper surface of the insulation layer 57 located around the through hole 57Y. The upper surface of the wiring layer 58 includes a recess. The wiring layer 58 functions as a connection pad P3, which is electrically connected to another semiconductor package 62 (refer to FIG. 12). That is, the through hole 57Y includes the recessed connection pad P3.

If necessary, a surface-processed layer may be formed on the surface (upper and side surfaces, or only upper surface) of the connection pad P3. Examples of the surface-processed layer are a layer of Au, a layer of Ni/Au (a metal layer in which an Ni layer and an Au layer are sequentially stacked), and a layer of Ni/Pd/Au (a metal layer in which an Ni layer, a Pd layer, and an Au layer are sequentially stacked). For example, an electroless plating metal layer may be used as the layer of Ni, the layer of Au, or the layer of Pd. The surface-processed layer may be formed by performing an anti-oxidation process, such as the OSP process.

For example, the connection pads P3 are located in the wiring structure 12A in a peripheral arrangement as viewed from above. The connection pad P3 may have any shape and size as viewed from above. For example, the connection pad P3 may have a diameter of approximately 120 to 170 μm as viewed from above.

The semiconductor chip 70 is flip-chip-mounted on the wiring substrate 10A. That is, the connection terminal 71 of the semiconductor chip 70 is joined with the pad P1 of the wiring substrate 10A by the joint member 72.

Figure 12:
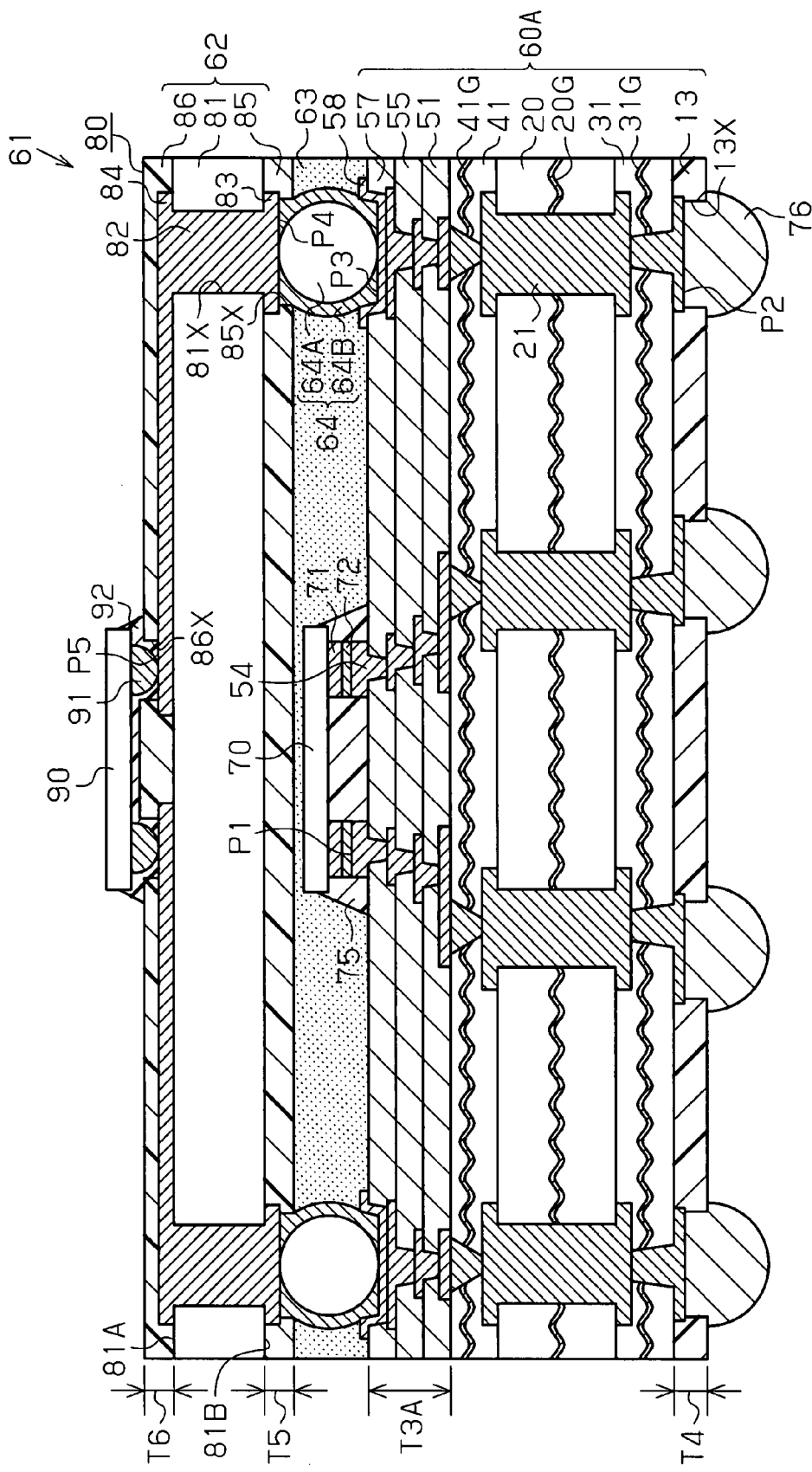
FIG. 12 is a schematic cross-sectional view illustrating a semiconductor device including the semiconductor package of FIG. 11.

The structure of a semiconductor device 61 will now be described with reference to FIG. 12.

The semiconductor device 61 includes the semiconductor package 60A, the semiconductor package 62, which is stacked on and joined with the semiconductor package 60A, an encapsulation resin 63 formed between the semiconductor packages 60A and 62, and the external connection terminal 76.

The semiconductor package 62 includes a wiring substrate 80, one or more semiconductor chips 90 mounted on the wiring substrate 80, and an underfill resin 92 formed between the wiring substrate 80 and the semiconductor chip 90.

The wiring substrate 80 includes a core substrate 81, a through electrode 82 arranged in the core substrate 81, the lowermost wiring layer 83, the uppermost wiring layer 84, and solder resist layers 85 and 86.

The core substrate 81 is located in the middle of the wiring substrate 80 in the thicknesswise direction. For example, the thickness of the core substrate 81 may be approximately 80 to 800 μm.

Through holes 81X are formed in predetermined locations (two locations in FIG. 12) of the core substrate 81. The through hole 81X extends through the core substrate 81 from an upper surface 81A to a lower surface 81B. The through electrode 82, which extends through the core substrate 81 in the thicknesswise direction, is formed in the through hole 81X. That is, the through hole 81X is filled with the through electrode 82. For example, the through hole 81X and the through electrode 82 are circular as viewed from above, which is not illustrated in the drawing.

The wiring layer 83 is formed on the lower surface 81B of the core substrate 81, and the wiring layer 84 is formed on the upper surface 81A of the core substrate 81. The through electrode 82 electrically connects the wiring layers 83 and 84 to each other. For example, copper or a copper alloy may be used as the material of the through electrode 82 and the wiring layers 83 and 84.

The solder resist layer 85 is stacked on the lower surface 81B of the core substrate 81 to cover a portion of the wiring layer 83. For example, a photosensitive insulative resin, the main component of which is a phenol resin or a polyimide resin, may be used as the material of the solder resist layer 85. The solder resist layer 85 may include a filler, such as silica or alumina. To reduce the warpage, preferably, the thickness T5 of the solder resist layer 85 is set to be equal to the thickness T4 of the solder resist layer 13 of the semiconductor package 60A. For example, the thickness T5 of the solder resist layer 85 may be approximately 20 to 40 µm.

The solder resist layer 85 includes an opening 85X, which exposes a portion of the wiring layer 83 as a connection pad P4. The connection pad P4 is used to electrically connect to another semiconductor package 60A. The connection pad P4 is arranged corresponding to the connection pad P3 formed in the semiconductor package 60A. That is, the connection pads P4 are located in the wiring substrate 80 in a peripheral arrangement as viewed from above. The connection pad P4 and the opening 85X may have any shape and size as viewed from above. For example, the connection pad P4 and the opening 85X may each be circular with a diameter of approximately 120 to 170 µm as viewed from above.

If necessary, a surface-processed layer may be formed on the wiring layer 83 exposed in the opening 85X (i.e., connection pad P4). As the surface-processed layer, for example, the same surface-processed layer as one formed on the connection pad P3 may be used.

The solder resist layer 86 is stacked on the upper surface 81A of the core substrate 81 to cover a portion of the wiring layer 84. For example, a photosensitive insulative resin, the main component of which is a phenol resin or a polyimide resin, may be used as the material of the solder resist layer 86. The solder resist layer 86 may include a filler, such as silica or alumina. To reduce the warpage of the semiconductor device 61, preferably, the thickness T6 of the solder resist layer 86 is set to be equal to the thickness T4 of the solder resist layer 13 of the semiconductor package 60A. For example, the thickness T6 of the solder resist layer 86 may be approximately 20 to 40 µm.

In this manner, to reduce the warpage, in the semiconductor device 61, the thickness T3A of the wiring structure 12A, the thickness T4 of the solder resist layer 13, the thickness T5 of the solder resist layer 85, and the thickness T6 of the solder resist layer 86 are set to be the same, preferably.

The solder resist layer 86 includes an opening 86X, which exposes a portion of the wiring layer 84 as a pad P5. The pad P5 is used to electrically connect to an electronic component, such as a semiconductor chip or a passive element. The pad P5 and the opening 86X may have any shape and size as viewed from above. For example, the connection pad P5 and the opening 86X may each be circular with a diameter of approximately 50 to 100 µm as viewed from above.

If necessary, a surface-processed layer may be formed on the wiring layer 84 exposed in the opening 86X (i.e., pad P5). As the surface-processed layer, for example, the same surface-processed layer as one formed on the connection pad P3 may be used.

The semiconductor chip 90 is flip-chip-mounted on the wiring substrate 80. More specifically, the pads P5 are joined with bumps 91 arranged on the circuit formation surface of the semiconductor chip (lower surface, in FIG. 12). This electrically connects the semiconductor chip 90 to the wiring layer 84 by the bump 91.

A logic chip, such as a CPU or a GPU, or a memory chip, such as a DRAM chip or an SRAM chip, may be used as the semiconductor chip 90. For example, a gold bump or a solder bump may be used as the bump 91. For example, an alloy containing Pb, an alloy of Sn and Au, an alloy of Sn and Cu, an alloy of Sn and Ag, an alloy of Sn, Ag, and Cu may be used as the material of the solder bump.

A gap between the wiring substrate 80 and the semiconductor chip 90 is filled with the underfill resin 92. For example, an insulative resin, such as an epoxy resin, may be used as the material of the underfill resin 92.

A solder ball 64 is joined with the recessed connection pad P3 formed in the semiconductor package 60A. The solder ball 64, which is arranged between the semiconductor packages 60A and 62, is joined with the connection pads P3 and P4. The solder ball 64 functions as a connection terminal, which connects (joins) the semiconductor packages 60A and 62. The solder ball 64 also functions as a spacer, which maintains the distance (separated distance) of the semiconductor packages 60A and 62 at a predetermined value. For example, the height of the solder ball 64 is set to be greater than the thickness of the semiconductor chip 70. For example, the height of the solder ball 64 is set to be greater than the total thickness of the semiconductor chip 70, the connection terminal 71, the joint member 72, and the pad P1.

In the present example, the solder ball 64 includes a spherical copper core ball 64A and a solder 64B, which covers the surface of the copper core ball 64A. The solder 64B functions as a joint material, and the copper core ball 64A functions as a spacer. That is, the solder ball 64 is joined with the connection pads P3 and P4 by the solder 64B.

In this manner, the semiconductor device 61 having a package on package (POP) structure is formed by stacking and joining the semiconductor packages 60A and 62 with the solder ball 64.

A gap between the semiconductor packages 60A and 62 is filled with the encapsulation resin 63. The encapsulation resin 63 fixes the semiconductor package 62 to the semiconductor package 60A and encapsulates the semiconductor chip 70 mounted on the wiring substrate 10A. That is, the encapsulation resin 63 functions as an adhesion agent, which bonds the semiconductor packages 60A and 62, and as a protection layer, which protects the semiconductor chip 70. Additionally, the arrangement of encapsulation resin 63 improves the overall mechanical strength of the semiconductor device 61.

The method for manufacturing the semiconductor device 61 will now be described. Although a single semiconductor device 61 is enlarged in the description below, in the actual process, after manufacturing a batch of the semiconductor devices 61 on one substrate, the substrate is fragmentized into individual semiconductor devices 61.

The method for manufacturing the wiring substrate 10A will now be described.

In the step illustrated in FIG. 13A, by performing the same manufacturing procedures as illustrated in FIGS. 3 to 9, the wiring layer 50, the insulation layer 51, the wiring layer 52, the insulation layer 55, and the wiring layer 56 are sequentially stacked on the uppermost insulation layer 41 of the wiring structure 11.

The insulation layer 57 is formed on the upper surface of the insulation layer 55 to entirely cover the surfaces (upper and side surfaces) of the wiring layer 56. The insulation layer 55 is formed in the same manner as the insulation layer 51.

In the step illustrated in FIG. 13B, the through holes 57X and 57Y are formed in predetermined locations of the insulation layer 57, for example, by the photolithography process. The through holes 57X and 57Y extend through the insulation layer 57 in the thicknesswise direction and expose portions of the upper surface of the wiring layer 56. In this step, the through hole 57Y having a small aspect ratio (large opening diameter) is formed in a region close to the peripheral edge of the insulation layer 57. The through hole 57X having a larger aspect ratio than the through hole 57Y (small opening diameter) is formed in a region located inward from the region where the through hole 57Y is formed. In this manner, a plurality of types (here, two types) of the through holes 57X and 57Y having different aspect ratios are formed.

In the step illustrated in FIG. 14A, a seed layer 104 is formed to entirely cover the surfaces (upper and side surfaces) of the insulation layer 57 and the upper surface of the wiring layer 56 exposed on the insulation layer 57. The seed layer 104 is formed, for example, by the sputtering process or the electroless plating process.

A resist layer 106 is formed on the seed layer 104. The resist layer 106 includes opening patterns 106X and 106Y in predetermined locations. The opening pattern 106X exposes the seed layer 104 on a location corresponding to the region where the wiring layer 54 is formed (refer to FIG. 11). The opening pattern 106Y exposes the seed layer 104 on a location corresponding to the region where the wiring layer 58 is formed. As the material of the resist layer 106, for example, a material having a plating resistance against the plating process performed in the next step may be used. For example, the same material as the resist layer 101 may be used as the material of the resist layer 106. Also, the resist layer 106 may be formed through the same process as the resist layer 101.

In the step illustrated in FIG. 14B, the electrolytic plating, for example, the electrolytic copper plating, is performed by using the resist layer 106 as a plating mask and the seed layer 104 as a plating power supplying layer. This forms the electrolytic copper plating layer 105 on the upper surface of the seed layer 104 exposed in the opening pattern 106X and an electrolytic copper plating layer 107 on the upper surface of the seed layer 104 exposed in the opening pattern 106Y.

In the step illustrated in FIG. 15A, the resist layer 106 illustrated in FIG. 14B is removed using an alkaline dissociation solution. An unnecessary portion of the seed layer 104 is removed by etching using the electrolytic copper plating layers 105 and 107 as etching masks. This forms the wiring layers 54 and 58 on the wiring layer 56 and the insulation layer 57. The wiring layer 54 includes the projected pad P1, which projects upward from the upper surface of the insulation layer 57. The wiring layer 58 includes the recessed connection pad P3. The wiring layer 54 is formed by the seed layer 104 and the electrolytic copper plating layer 105, and the wiring layer 58 is formed by the seed layer 104 and the electrolytic copper plating layer 107.

In this manner, the manufacturing procedures illustrated in FIGS. 13B to 15A simultaneously forms two types of pads having different structures, that is, the projected pad P1 and the recessed connection pad P3. More specifically, the aspect ratio of the through hole 57Y is set to a considerably lower value than that of the through hole 57X (for example, a value greater by 0.2 to 0.4 times). Thus, even when the electrolytic plating is simultaneously performed on the seed layers 104 exposed in the through holes 57X and 57Y, the projected pad P1 may be formed on the via wire filling the through hole 57X and the recessed connection pad P3 may be formed in the through hole 57Y corresponding to the aspect ratios of the through holes 57X and 57Y. Through the manufacturing procedures, the wiring structure 12A is stacked on the upper surface 41A of the uppermost insulation layer 41 of the wiring structure 11.

The solder resist layer 13 is stacked on the lower surface of the insulation layer 31. The solder resist layer 13 includes the opening 13X, which exposes a portion of the lowermost wiring layer 32 as the external connection pad P2. Through the manufacturing procedures, the wiring substrate 10A illustrated in FIG. 11 is manufactured.

In the step illustrated in FIG. 15B, the connection terminal 71 of the semiconductor chip 70 is flip-chip-joined with the pad P1 (wiring layer 54) of the wiring substrate 10A. A gap between the semiconductor chip 70 and the wiring substrate 10A is filled with the underfill resin 75. Then, the underfill resin 75 is cured. Through the manufacturing procedures, the semiconductor package 60A illustrated in FIG. 11 may be manufactured.

Figure 16:
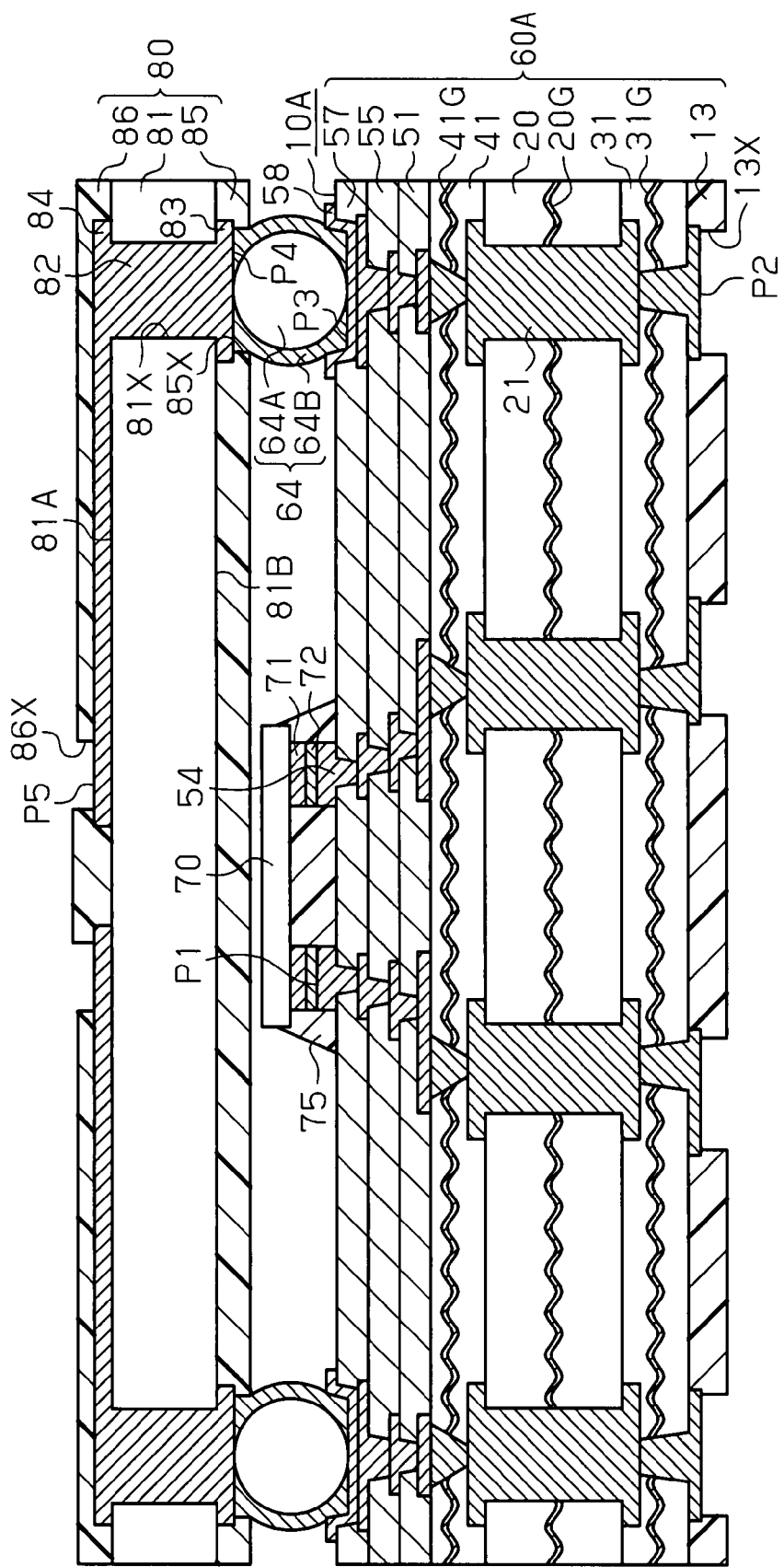
FIGS. 16 to 18 are schematic cross-sectional views illustrating a method for manufacturing the semiconductor device of FIG. 12.

In the step illustrated in FIG. 16, the wiring substrate 80 is prepared. The wiring substrate 80 is manufactured through a known manufacturing method that will now be briefly described with reference to FIG. 16.

First, the through hole 81X is formed in a predetermined location of the core substrate 81. The through electrode 82, which fills the through hole 81X, is formed. Next, the wiring layers 83 and 84 are formed on the lower surface 81B and the upper surface 81A of the core substrate 81, for example, by the subtractive process. The solder resist layer 85, which includes the opening 85X, is formed. The opening 85X exposes a portion of the wiring layer 83 as the connection pad P4. Then, the solder resist layer 86, which includes the opening 86X, is formed. The opening 86X exposes a portion of the wiring layer 84 as the pad P5. Through the above procedures, the wiring substrate 80 may be manufactured.

The solder ball 64 is joined with the connection pad P3 or the connection pad P4. For example, after appropriately applying flux to the connection pad P4, the flux is joined with the solder ball 64. Then, the solder ball 64 is fixed to the connection pad P4 by performing reflow soldering at approximately 230° C. to 260° C. Subsequently, the unnecessary flux is removed by a surface cleaning process. Then, the wiring substrate 80 is located above the semiconductor package 60A, and the solder ball 64 is joined with the connection pad P3. For example, flux is appropriately applied to the connection pad P3. The wiring substrate 80 is located on the semiconductor package 60A as having the solder ball 64 in between. The semiconductor package 60A and the wiring substrate 80 are heated to a temperature of approximately 230° C. to 260° C. in a reflow oven. This melts the solder 64B of the solder ball 64 and joins the solder ball 64 with the connection pad P3. As a result, the solder ball 64 electrically connects the connection pads P3 and P4 and also fixes the wiring substrate 80 to the semiconductor package 60A.

The semiconductor package 60A (wiring substrate 10A) has the same advantages as the first embodiment. That is, in the same manner as the semiconductor package 60, the semiconductor package 60A includes the wiring structure 11. The thickness T3A of the wiring structure 12A is set to be substantially the same as the thickness T4 of the solder resist layer 13. This decreases the warpage of the semiconductor package 60A and maintains the semiconductor package 60A in a flat state. Thus, the wiring substrate 80 may be easily joined with the semiconductor package 60A.

Figure 17:
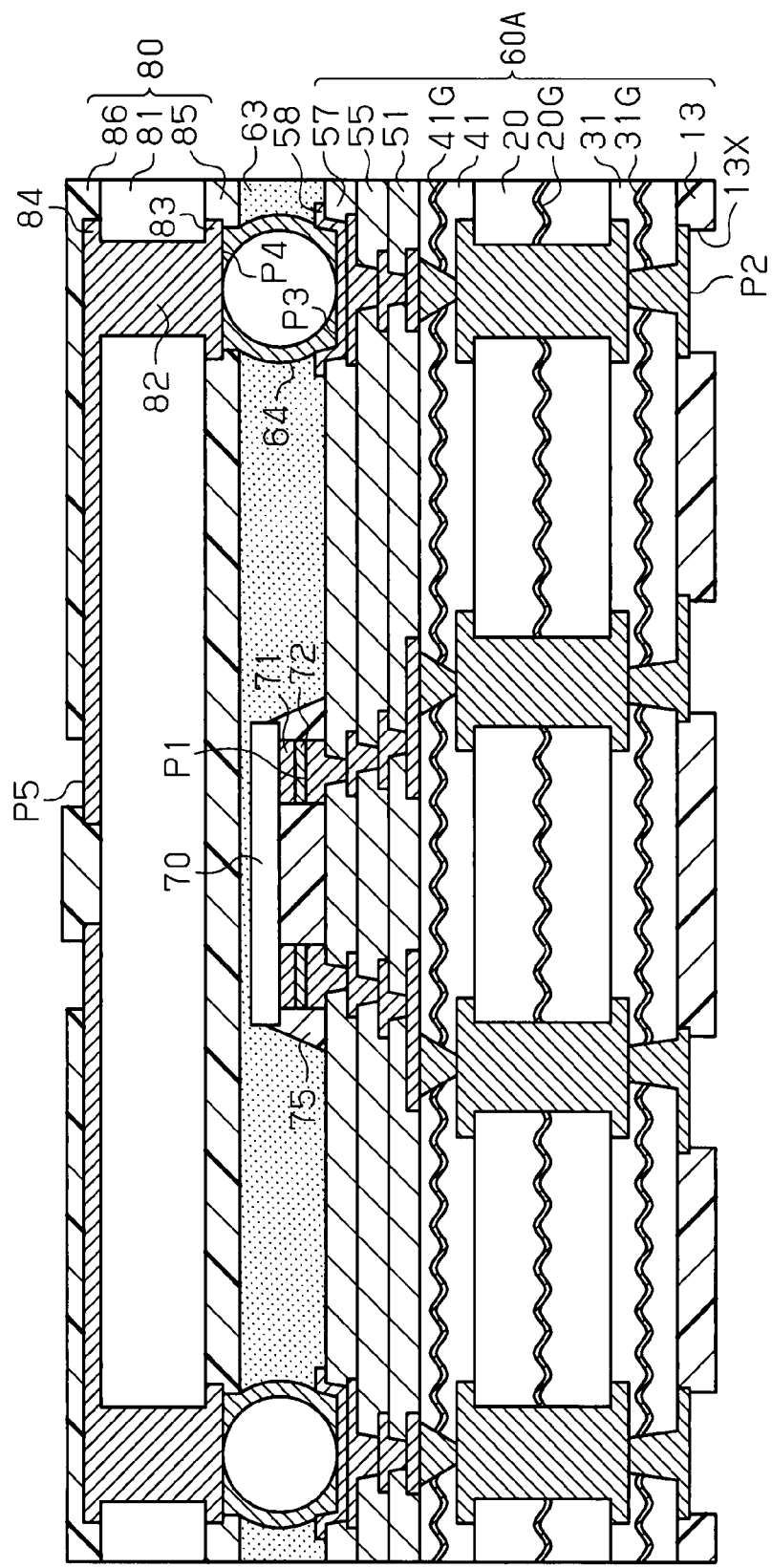

In the step illustrated in FIG. 17, the encapsulation resin 63 is formed to fill a gap between the semiconductor package 60A and the wiring substrate 80, more specifically, a gap between the insulation layer 57 and the solder resist layer 85.

The encapsulation resin 63 firmly fixes the semiconductor package 60A to the wiring substrate 80. For example, when a thermosetting molding resin is used as the material of the encapsulation resin 63, the structure illustrated in FIG. 16 is placed in a mold. Then, the mold is pressurized (for example, to 5 to 10 MPa) and the mold is filled with the molding resin. The molding resin is heated to a temperature of, for example, 180° C. and cured to form the encapsulation resin 63. Examples of processes for filling the mold with molding resin are a transfer molding process, a compression molding process, and an injection molding process.

Figure 18:
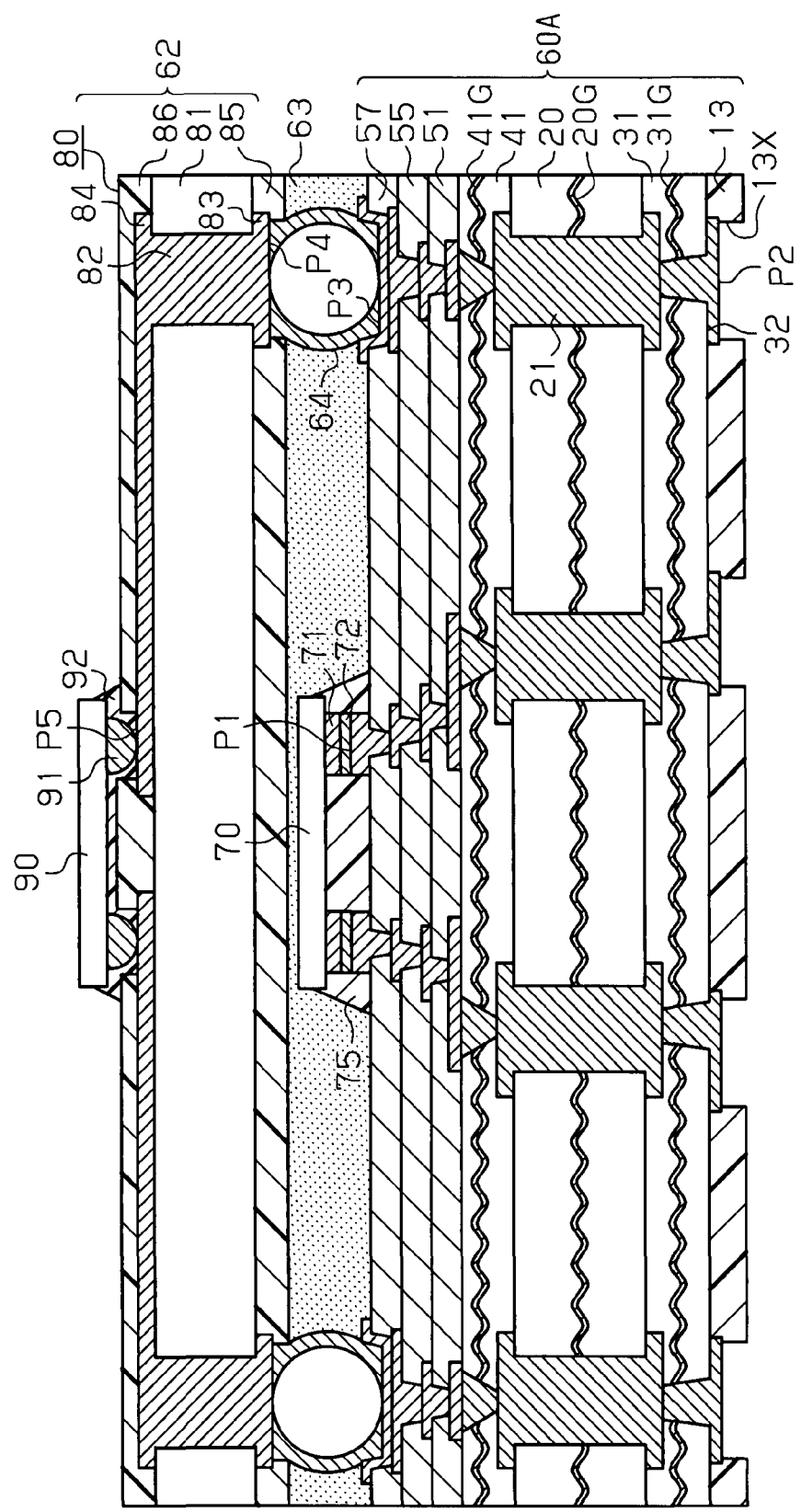

In the step illustrated in FIG. 18, the bump 91 of the semiconductor chip 90 is flip-chip-joined with the pad P5 of the wiring substrate 80. A gap between the semiconductor chip 90 and the wiring substrate 80 is filled with the underfill resin 92. Then, the underfill resin 92 is cured.

Through the manufacturing procedures, the semiconductor package 62 is manufactured, and the semiconductor package 62 is joined with the semiconductor package 60A.

The external connection terminal 76 (refer to FIG. 12) is formed on the external connection pad P2 of the semiconductor package 60A. Through the manufacturing procedures, the semiconductor device 61 illustrated in FIG. 12 may be manufactured.

The second embodiment has the following advantages in addition to advantages (1) to (8) of the first embodiment.

(9) The semiconductor device 61 includes the semiconductor package 62 stacked on the semiconductor package 60A. The semiconductor package 62 thickens the overall thickness of the semiconductor device 61. This improves the rigidity of the semiconductor device 61 and decreases the warpage of the semiconductor device 61.

(10) The encapsulation resin 63 is formed between the semiconductor packages 60A and 62. This improves the rigidity of the whole semiconductor device 61 as compared to when the encapsulation resin 63 is not arranged. Thus, the warpage of the semiconductor device 61 may be decreased.

(11) The uppermost layer of the wiring substrate 10A includes two types of pads having different structures, the projected pad P1 and the recessed connection pad P3. The projected pad P1, which is used to connect the semiconductor chip 70, easily copes with when the connection terminal 71 of the semiconductor chip 70 has a narrower pitch. The recessed connection pad P3, which is used to connect the semiconductor package 62, reduces the overall thickness of the semiconductor device 61.

(12) The thickness T3A of the wiring structure 12A, the thickness T4 of the solder resist layer 13, the thickness T5 of the solder resist layer 85, and the thickness T6 of the solder resist layer 86 are set to be the same. By setting the thickness T5 of the solder resist layer 85 to be the same as the thickness T6 of the solder resist layer 86, the rigidity distribution of the wiring substrate 80 in the vertical direction is substantially symmetric at the portion above the core substrate 81 and the portion below the core substrate 81. Further, by setting the thickness T5 and T6 of the solder resist layer 85 and 86 to be the same as the thickness T4 of the solder resist layer 13, the rigidity distribution of the wiring substrate 80 is substantially the same as the rigidity distribution of the wiring substrate 10A. As a result, in the semiconductor device 61, the rigidity balance at the above portion of the encapsulation resin 63 and the below portion of the encapsulation resin 63 may be improved. This limits the generation of warpage and undulation in the semiconductor device 61.

The second embodiment may be modified as described below.

Figure 19:
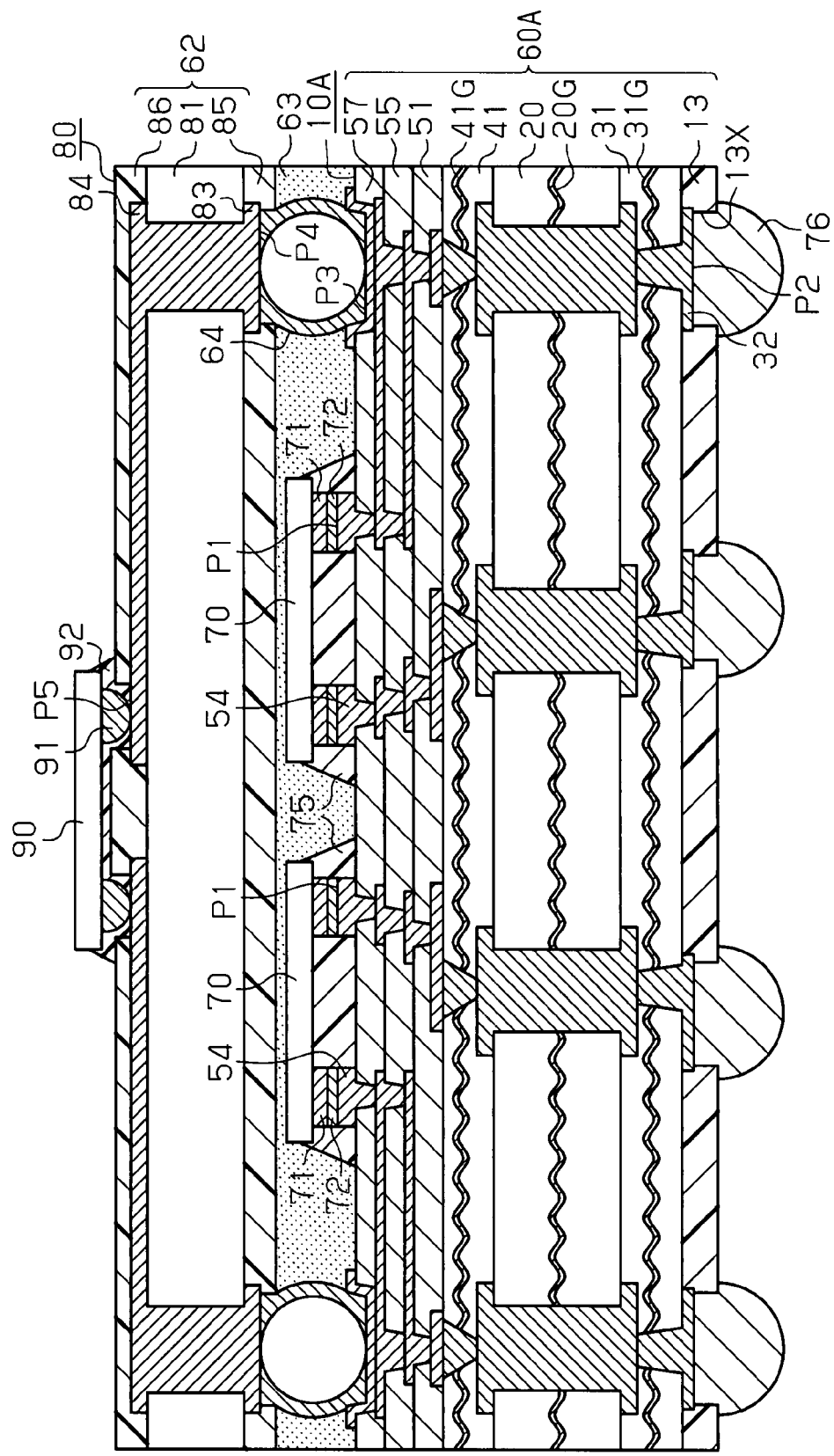
FIGS. 19 to 21 are schematic cross-sectional views illustrating various modified examples of the semiconductor device.

As illustrated in FIG. 19, a plurality of the semiconductor chips 70 may be mounted on the wiring substrate 10A. For example, a logic chip and a memory chip may be mounted on the wiring substrate 10A. Alternatively, a CPU chip and a DRAM chip may be mounted on the wiring substrate 10A, or a GPU chip and a DRAM chip may be mounted on the wiring substrate 10A.

Figure 20:
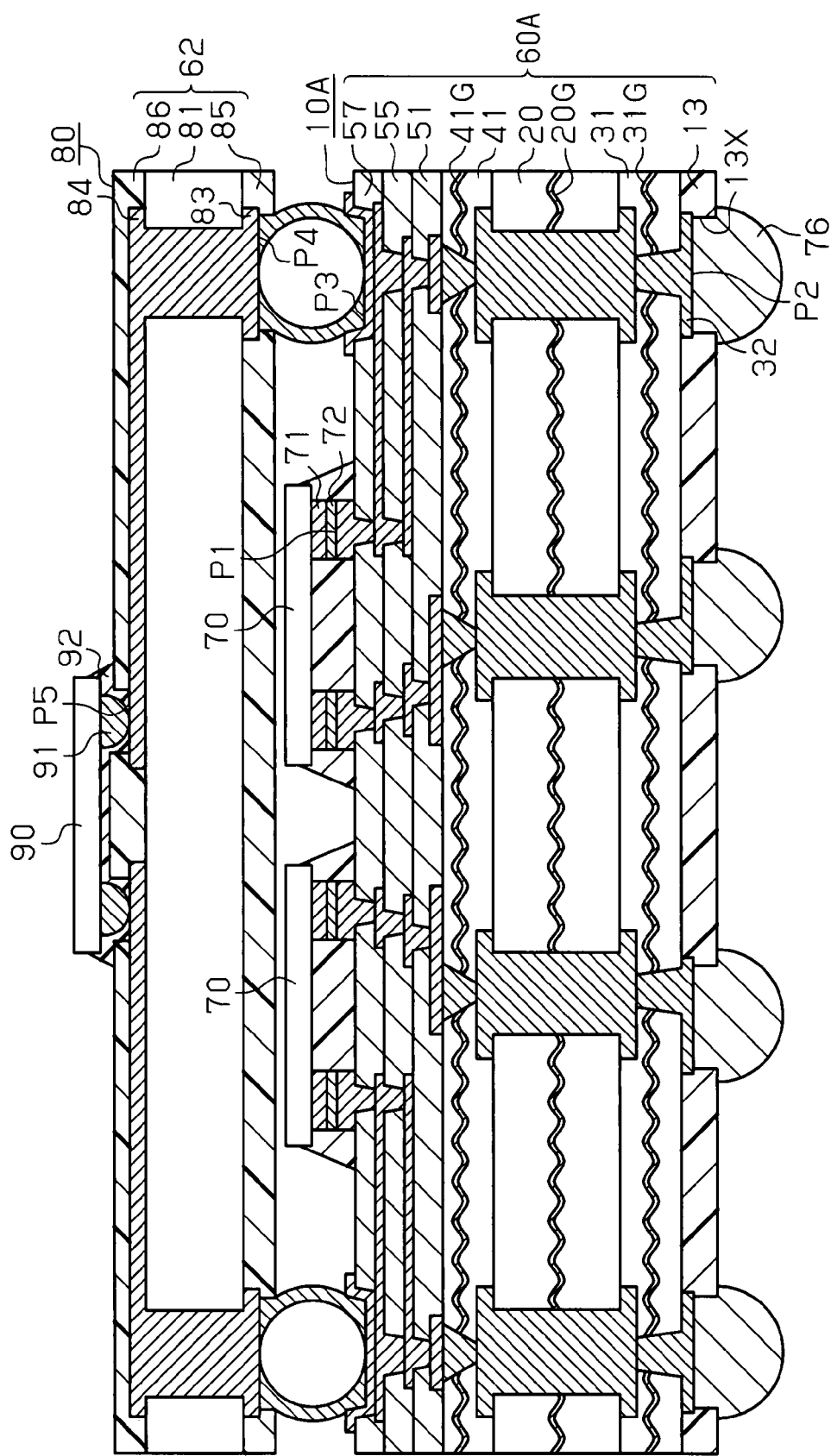

As illustrated in FIG. 20, the encapsulation resin 63 may be omitted from the second embodiment and the above modified examples.

In the wiring substrate 80 of the second embodiment and the above modified examples, the structure located closer to the center than the outermost wiring layers 83 and 84 is not particularly limited as long as the outermost wiring layers 83 and 84 are electrically connected to each other through the substrate. For example, the structure and material of the core substrate 81 is not particularly limited. A certain number of wiring layers and insulation layers may be stacked on the upper surface 81A and the lower surface 81B of the core substrate 81. The wiring substrate 80 may be a coreless substrate, which does not include the core substrate 81.

In the second embodiment and the above modified examples, the copper core ball 64A is used as the conductive core ball of the solder ball 64. Instead of the copper core ball 64A, for example, a conductive core ball formed from a metal other than copper, such as gold or nickel, may be used, or a resin core ball formed from a resin may be used. Alternatively, instead of the solder ball 64, a solder ball that does not include a conductive core ball or a resin core ball may be used.

In the second embodiment and the above modified examples, the solder ball 64 is used as the connection terminal connecting the semiconductor package 60A (wiring substrate 10A) and the semiconductor package 62 (wiring substrate 80). Instead, for example, a rod-shaped connection terminal, such as a metal post, or a connection terminal having spring-like properties may be used as the connection terminal connecting the semiconductor package 60A (wiring substrate 10A) and the semiconductor package 62 (wiring substrate 80).

In the second embodiment and the above modified examples, the semiconductor package 62 is joined with the semiconductor package 60A. More specifically, the solder ball 64 is joined with the recessed connection pad P3 formed on the semiconductor package 60A, and the semiconductor package 60A is joined with the semiconductor packages 62 by the solder ball 64.

Figure 21:
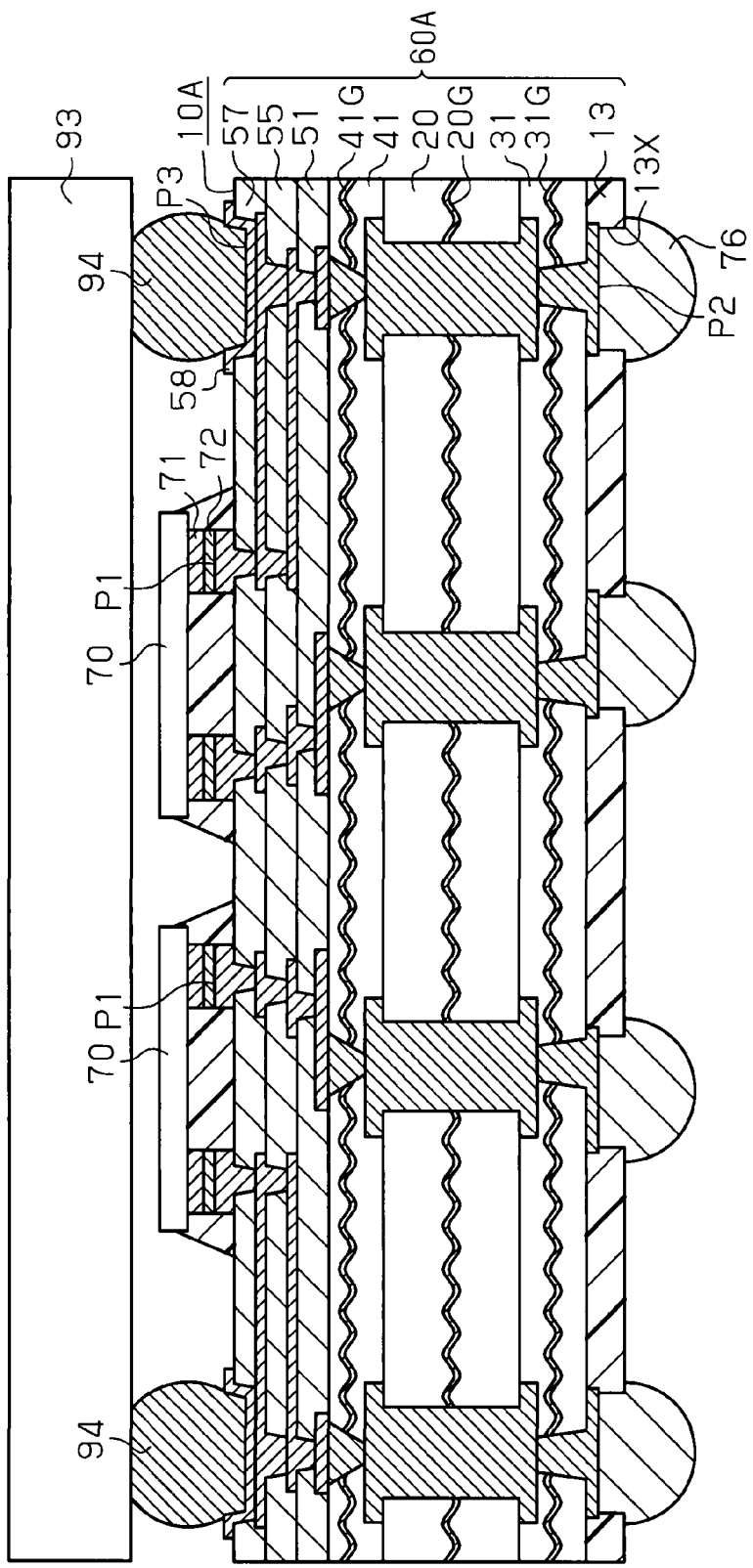

However, there is no limit to such a configuration. For example, as illustrated in FIG. 21, a semiconductor chip 93, which is different from the semiconductor chip 70, may be mounted on the semiconductor package 60A. For example, the semiconductor chip 93 may be flip-chip-mounted on the upper surface of the semiconductor package 60A. In this case, the connection pads P3 are joined with bumps 94 arranged on the circuit formation surface of the semiconductor chip 93 (here, lower surface). This electrically connects the semiconductor chip 93 to the wiring layer 58 by the bumps 94.

A logic chip, such as a CPU or a GPU, or a memory chip, such as a DRAM chip or an SRAM chip, may be used as the semiconductor chip 93. For example, a gold bump or a solder bump may be used as the bump 94. For example, an alloy containing Pb, an alloy of Sn and Au, an alloy of Sn and Cu, an alloy of Sn and Ag, an alloy of Sn, Ag, and Cu may be used as the material of the solder bump.

In the second embodiment and the above modified examples, the recessed connection pad P3 may be changed to a projected connection pad.

Third Embodiment

A third embodiment will now be described with reference to FIG. 22. Like or same reference numerals are given to those components that are the same as the corresponding components illustrated in FIGS. 1 to 21. Such components will not be described in detail.

In the above embodiments and modified examples, the single insulation layer 41 (first insulation layer) is formed on the upper surface 20A of the core substrate 20, and the single insulation layer 31 (second insulation layer) is formed on the lower surface 20B of the core substrate 20. However, there is no limit to such a configuration. Two or more insulation layers may be formed on each of the upper surface 20A and the lower surface 20B of the core substrate 20. In this case, preferably, each insulation layer includes a reinforcement material.

Figure 22:
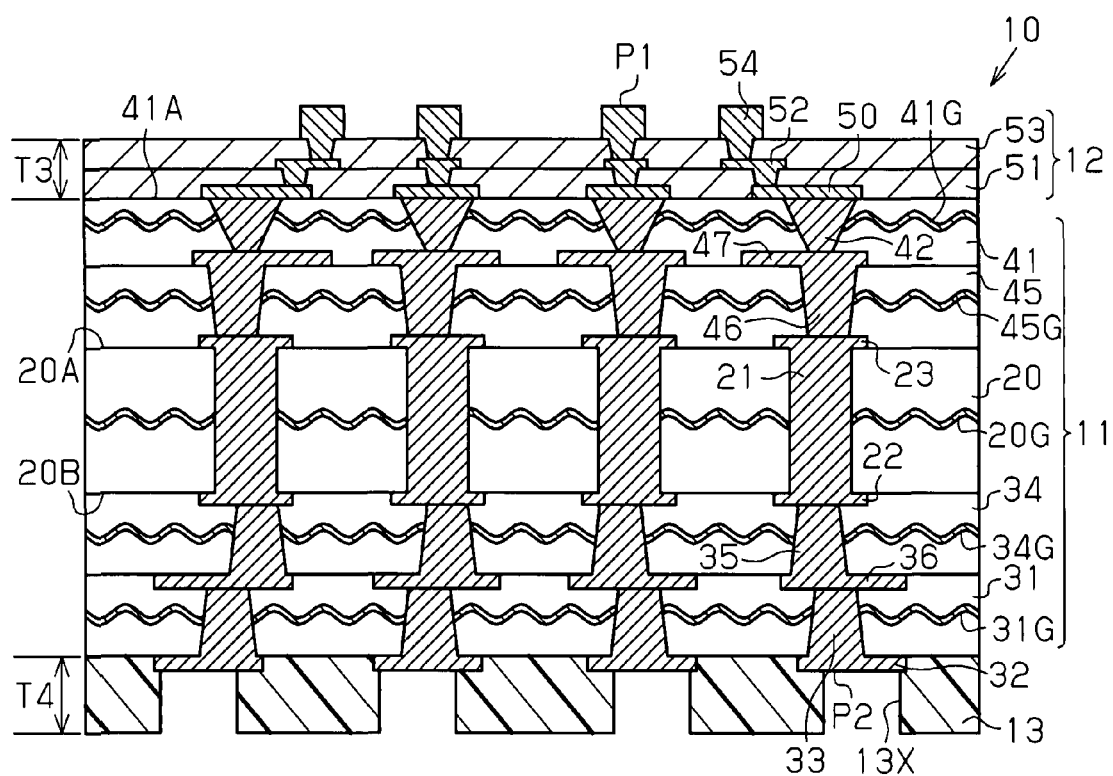
FIG. 22 is a schematic cross-sectional view illustrating the wiring substrate of a modified example.

For example, as illustrated in FIG. 22, the insulation layers 41 and 45, each of which includes a reinforcement material, (first insulation layer) may be stacked on the upper surface 20A of the core substrate 20, and the insulation layers 31 and 34, each of which includes a reinforcement material, (second insulation layer) may be stacked on the lower surface 20B of the core substrate 20. The structure of the wiring structure 11 including the core substrate 20 and the insulation layers 31, 34, 41, and 45 will now be described.

In the same manner as the insulation layers 31 and 41, a thermosetting insulative resin including a reinforcement material may be used as the material of the insulation layers 34 and 45. For example, a glass epoxy resin may be used as the material of the insulation layers 34 and 45. A glass epoxy resin is obtained by impregnating a thermosetting insulative resin, the main component of which is an epoxy resin, in a glass cloth (glass woven cloth) as a reinforcement material and curing the resin.

The insulation layer 34 is stacked on the lower surface 20B of the core substrate 20 to cover the wiring layer 22. A glass cloth 34G is arranged in the middle of the insulation layer 34 in the thicknesswise direction. The glass cloth 34G has the same structure as the glass cloth 41G.

The insulation layer 34 includes a via wire 35, which extends through the insulation layer 34 in the thicknesswise direction. A wiring layer 36 is formed on the lower surface of the insulation layer 34. The wiring layer 36 is electrically connected to the wiring layer 22 by the via wire 35. The insulation layer 31 is stacked on the lower surface of the insulation layer 34 to cover the wiring layer 36. In the same manner as the first embodiment, the insulation layer 31 includes the via wire 33, and the lowermost wiring layer 32 is formed on the lower surface of the insulation layer 31.

The solder resist layer 13, which includes the opening 13X, is formed on the lower surface of the lowermost insulation layer 31.

The insulation layer 45 is stacked on the upper surface 20A of the core substrate 20 to cover the wiring layer 23. A glass cloth 45G is arranged in the middle of the insulation layer 45 in the thicknesswise direction. The glass cloth 45G has the same structure as the glass cloth 41G.

The insulation layer 45 includes a via wire 46, which extends through the insulation layer 45 in the thicknesswise direction. A wiring layer 47 is formed on the upper surface of the insulation layer 45. The wiring layer 47 is electrically connected to the wiring layer 23 by the via wire 46. The insulation layer 41 is formed on the upper surface of the insulation layer 45 to cover the wiring layer 47. In the same manner as the first embodiment, the insulation layer 41 includes the via wire 42.

The wiring structure 12 is stacked on the upper surface 41A of the uppermost insulation layer 41. In the insulation layer 41, the glass cloth 41G is located upper than the centerline of the insulation layer 41 in the thicknesswise direction.

The above structure has the same advantages as the first embodiment. The wiring substrate 10A of the second embodiment may be changed in the same manner.

It should be apparent to those skilled in the art that the present invention may be embodied in many other specific forms without departing from the scope of the invention. Particularly, it should be understood that the present invention may be embodied in the following forms.

In the above embodiments and modified examples, the thickness T4 of the solder resist layer 13 is greater than or equal to the thicknesses T3 and T3A of the wiring structures 12 and 12A. Instead, for example, the thickness T4 of the solder resist layer 13 may be smaller than the thicknesses T3 and T3A of the wiring structures 12 and 12A.

In the above embodiments and modified examples, the insulation layer 41 is thinner than the insulation layer 31. Instead, for example, the insulation layers 41 and 31 may have the same thickness.

In the above embodiments and modified examples, the upper end surface 42A of the via wire 42 is flush with the upper surface 41A of the insulation layer 41. Instead, for example, the upper end surface 42A of the via wire 42 may be recessed and located lower than the upper surface 41A of the insulation layer 41. Alternatively, the upper end surface 42A of the via wire 42 may upwardly project from the upper surface 41A of the insulation layer 41.

In the above embodiments and modified examples, the semiconductor chip 70 is mounted on the wiring substrates 10 and 10A. Further, in the second embodiment, the semiconductor chip 90 is mounted on the wiring substrate 80. In the modified example illustrated in FIG. 21, the semiconductor chip 93 is mounted on the wiring substrate 10A. However, there is no limit to such a configuration. For example, instead of the semiconductor chips 70, 90, and 93, a chip component, such as a chip capacitor, a chip resistance, or a chip inductor, or an electronic component such as a quartz crystal unit, may be mounted on the wiring substrates 10 and 10A.

Mounting manners of the semiconductor chips 70, 90, and 93, a chip component, and an electronic component such as a quartz crystal unit, may be variously modified or changed (for example, flip-chip mounting, wire-bonding mounting, solder mounting, and a combination of those).

In the wiring structure 11 of the above embodiments and modified examples, wiring manners and the number of the wiring layers 22, 23, 32, 36, and 47, the via wires 35, 33, 42, and 46, and the insulation layers 31, 34, 41, and 45 may be variously modified or changed.

In the above embodiments and modified examples, the through hole 20X of the core substrate 20 is filled with the through electrode 21. The through electrode 21 electrically connects the wiring layers 22 and 23 to each other. Instead, for example, a through hole plating layer may be arranged on the internal wall of the through hole 20X. The through hole plating layer, which functions as a through electrode, electrically connects the wiring layers 22 and 23 to each other. In this case, a hole of the through hole 20X located inward from the through hole plating layer may be filled with a resin.

In the wiring structure 12 of the above embodiments and modified examples, wiring manners and the number of the wiring layers 52, 54, 56, and 58, and the insulation layers 51, 53, 55, and 57 may be variously modified or changed.

Warpage Simulation

Example 1

A warpage simulation was performed on a wiring substrate (hereinafter, referred to as "wiring substrate A") having the same structure as the wiring substrate 10 illustrated in FIG. 1. The wiring substrate A was tetragonal with sides of 21 mm×15 mm as viewed from above. The core substrate 20 had a thickness of 410 µm. The wiring layers 22 and 23 had a thickness of 35 µm. The insulation layer 31 formed on the wiring layer 22 had a thickness of 40 µm. The wiring layer 50 had a thickness of 2 µm. The insulation layer 51 formed on the wiring layer 50 had a thickness of 3 µm. The wiring layer 52 formed on the insulation layer 51 had a thickness of 2 µm. The insulation layer 53 formed on the wiring layer 52 had a thickness of 3 µm. The pad P1 had a thickness of 10 µm. The solder resist layer 13 had a thickness of 25 µm. A warpage simulation was performed on the wiring substrate A by changing the removed amount of the insulation layer 41 from 0 µm to 2.5 µm, 5 µm, and 7.5 µm (i.e., the thickness of the insulation layer 41 was changed from 40 µm to 37.5 µm, 35 µm, and 32.5 µm). As a comparative example, the insulation layer 41 was changed to an insulation layer, which did not include a reinforcement material and had a thickness of 40 µm. The warpage simulation was performed on the insulation.

Figure 23:
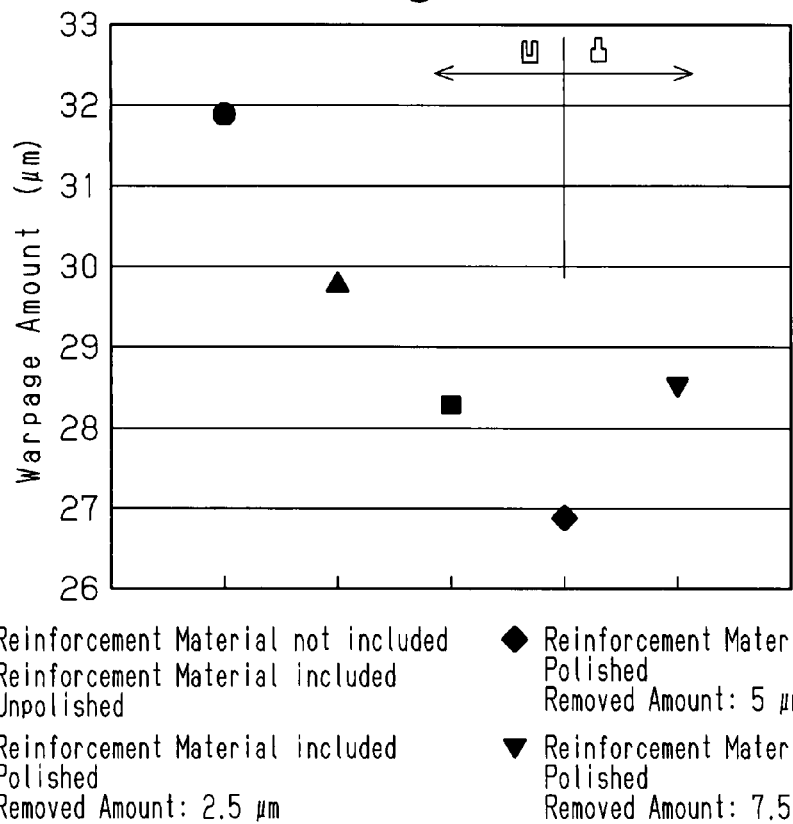
FIG. 23 is a chart illustrating the simulation result of the example 1.

FIG. 23 illustrates the simulation results of the example 1 and the comparative example. As illustrated in FIG. 23, it was observed that the application of the reinforcement material (glass cloth 41G) to the insulation layer 41 reduced the warpage amount of the wiring substrate A. It was observed that the polishing of the insulation layer 41 reduced the warpage amount of the wiring substrate A. Further, it was observed that the wiring structure 12 tends to warp in a downwardly curved manner when the removed amount of the insulation layer 41 is less than or equal to a predetermined value (here, 5 µm), and the wiring structure 12 tends to warp in an upwardly curved manner when the removed amount of the insulation layer 41 is greater than a predetermined value.

The above result indicates that, even in the wiring substrate A, which is asymmetric in the vertical direction, the warpage amount of the wiring substrate A may be reduced by polishing the insulation layer 41 including the reinforcement material. It is considered that the reduced thickness of the insulation layer 41 by polishing changes the rigidity distribution of the wiring substrate A in the vertical direction to be substantially symmetric at the above portion of the core substrate 20 and the below portion of the core substrate 20. This indicates that the adjustment of the removed amount of the insulation layer 41 (thickness of the insulation layer 41) changes the rigidity distribution of the wiring substrate A to be substantially symmetric in the vertical direction and reduces the warpage amount of the wiring substrate A.

Example 2

A warpage simulation was performed on a wiring substrate (hereinafter, referred to as "wiring substrate B") having the same structure as the wiring substrate 10A illustrated in FIG. 11. The wiring substrate B was tetragonal with sides of 40 mm×40 mm as viewed from above. The wiring structure 12A has the fixed thickness T3A of 15 µm. A warpage simulation was performed on the wiring substrate B by changing the thickness T4 of the solder resist layer 13 to 10 µm, 15 µm, 20 µm, 25 µm, 30 µm, and 40 µm. The wiring structure 11 has a fixed thickness. The core substrate 20 has a thickness of 200 µm.

Figure 24:
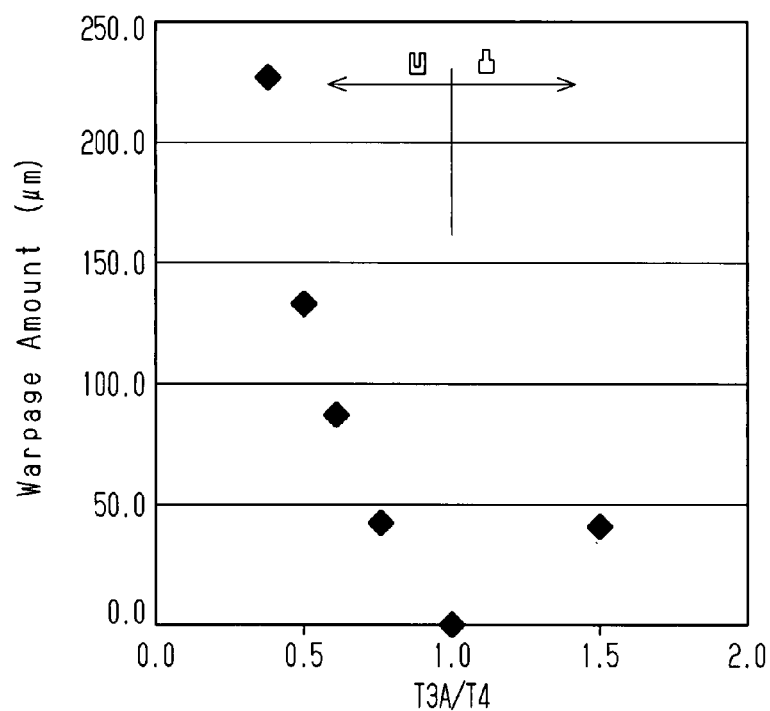
FIG. 24 is a chart illustrating the simulation result of the example 2.

FIG. 24 illustrates the simulation result of the example 2. As illustrated in FIG. 24, it was observed that, when the ratio T3A/T4 of the thickness T3A of the wiring structure 12A to the thickness T4 of the solder resist layer 13 is close to a predetermined value (here, one), the warpage amount of the wiring substrate B is reduced. Further, the wiring structure 12A tends to warp in an upwardly curved manner when the ratio T3A/T4 is greater than a predetermined value, and the wiring structure 12A tends to warp in a downwardly curved manner when the ratio T3A/T4 is less than a predetermined value.

The above result indicates that the warpage amount of the wiring substrate B may be reduced the most when the thickness T4 of the solder resist layer 13 is set to be the same as the thickness T3A of the wiring structure 12A. When the wiring substrate B includes the thinned core substrate 20, the warpage amount tends to reduce when the ratio T3A/T4 is close to one. The warpage amount tends to increase when the ratio T3A/T4 is greater or less than one.

CLAUSES

This disclosure further encompasses various embodiments described below.

1. A method for manufacturing a wiring substrate, the method including:
preparing a core substrate;
stacking a first insulation layer on an upper surface of the core substrate, wherein the first insulation layer is formed from a thermosetting insulative resin including a first reinforcement material;
stacking a second insulation layer on a lower surface of the core substrate, wherein the second insulation layer is formed from a thermosetting insulative resin including a second reinforcement material;
forming a through hole that extends through the first insulation layer in a thicknesswise direction;
forming a conductive layer that fills the through hole and covers an upper surface of the first insulation layer;
polishing the conductive layer and the upper surface of the first insulation layer so that the first reinforcement material is located upper than the centerline of the first insulation layer in the thicknesswise direction and so that a via wire, which includes an upper end surface exposed on the upper surface of the first insulation layer, is formed in the through hole;
stacking a second wiring structure, which includes a wiring layer and an insulation layer on the upper surface of the first insulation layer, wherein the main component of the insulation layer of the second wiring structure is a photosensitive resin; and
stacking an outermost insulation layer, of which the main component is a photosensitive resin, on a lower surface of the second insulation layer.

2. The method according to clause 1, wherein
the stacking a first insulation layer includes forming a first resin layer, which covers an upper surface of the first reinforcement material, and a second resin layer, which covers a lower surface of the second reinforcement material, and
the polishing the conductive layer and the upper surface of the first insulation layer includes reducing thickness of the first resin layer so that the first resin layer is thinner than the second resin layer.

The present examples and embodiments are to be considered as illustrative and not restrictive, and the invention is not to be limited to the details given herein, but may be modified within the scope and equivalence of the appended claims.

The invention claimed is:

1. A wiring substrate comprising:
a first wiring structure that includes
   a core substrate,
   a first insulation layer stacked on an upper surface of the core substrate and formed from a thermosetting insulative resin including a first reinforcement material,
   a second insulation layer stacked on a lower surface of the core substrate and formed from a thermosetting insulative resin including a second reinforcement material, wherein the first insulation layer is thinner than the second insulation layer, and
   a via wire formed in the first insulation layer;
a second wiring structure that includes
   a plurality of third insulation layers, of which the main component is a photosensitive resin, formed on an upper surface of the first insulation layer, and
   a plurality of first wiring layers alternately formed in the plurality of third insulation layers at the upper surface of the first insulation layer, wherein the plurality of first wiring layers include
      a lowermost first wiring layer formed on the upper surface of the first insulation layer and an upper end surface of the via wire, and
      an uppermost first wiring layer including a pad used to electrically connect a semiconductor chip and the lowermost first wiring layer;
a second wiring layer stacked on a lower surface of the second insulation layer; and
an outermost insulation layer, of which the main component is a photosensitive resin, stacked on the lower surface of the second insulation layer to cover the second wiring layer, wherein
   the outermost insulation layer includes an opening that exposes a portion of the second wiring layer as an external connection pad, and
   the second wiring structure has a higher wiring density than the first wiring structure.

2. The wiring substrate according to claim 1, wherein the first insulation layer includes
   the first reinforcement material,
   a first resin layer that covers an upper surface of the first reinforcement material, and
   a second resin layer that covers a lower surface of the first reinforcement material,
the first resin layer is thinner than the second resin layer, and
the first reinforcement material is located around the middle of a total thickness of the first insulation layer and the second wiring structure combined.

3. The wiring substrate according to claim 1, wherein the second reinforcement material is located in the middle of the second insulation layer in the thicknesswise direction.

4. The wiring substrate according to claim 1, wherein
the via wire is formed in a through hole that extends through the first insulation layer in the thicknesswise direction,
the upper end surface of the via wire is flush with the upper surface of the first insulation layer,
the wiring substrate further comprises a seed layer that electrically connects the lowermost first wiring layer of the second wiring structure and the upper end surface of the via wire, and
the upper surface of the first insulation layer and the upper end surface of the via wire are polished surfaces.

5. The wiring substrate according to claim 1, wherein the outermost insulation layer has a thickness that is greater than or equal to a total thickness of all of the third insulation layers of the second wiring structure.

6. The wiring substrate according to claim 1, wherein
the plurality of third insulation layers include a lowermost third insulation layer formed on the upper surface of the first insulation layer to cover the lowermost first wiring layer, and
an upper surface of the lowermost third insulation layer has a lower surface roughness than the upper surface of the first insulation layer.

7. The wiring substrate according to claim 1, wherein the wiring substrate is asymmetric with respect to vertical position of the core substrate in the first wiring structure.

8. A wiring substrate comprising:
a first wiring structure that includes
   a core substrate,
   a first insulation layer stacked on an upper surface of the core substrate and formed from a thermosetting insulative resin including a first reinforcement material,
   a second insulation layer stacked on a lower surface of the core substrate and formed from a thermosetting insulative resin including a second reinforcement material, wherein the first insulation layer is thinner than the second insulation layer, and
   a via wire formed in the first insulation layer;
a second wiring structure that includes
   a plurality of third insulation layers, of which the main component is a photosensitive resin, formed on an upper surface of the first insulation layer, and
   a plurality of first wiring layers alternately formed in the plurality of third insulation layers at the upper surface of the first insulation layer, wherein the plurality of first wiring layers include
      a lowermost first wiring layer formed on the upper surface of the first insulation layer and an upper end surface of the via wire, and
      an uppermost first wiring layer including a pad used to electrically connect a semiconductor chip and the lowermost first wiring layer;
a second wiring layer stacked on a lower surface of the second insulation layer; and
an outermost insulation layer, of which the main component is a photosensitive resin, stacked on the lower surface of the second insulation layer to cover the second wiring layer, wherein
the outermost insulation layer includes an opening that exposes a portion of the second wiring layer as an external connection pad,
the second wiring structure has a higher wiring density than the first wiring structure,
the upper surface of the first insulation layer and the upper end surface of the via wire are polished surfaces, and
the first reinforcement material is located closer to the polished surfaces than the center of the first insulation layer in the thicknesswise direction.

9. The wiring substrate according to claim 8, wherein the first insulation layer includes
   the first reinforcement material,
   a first resin layer that covers an upper surface of the first reinforcement material, and
   a second resin layer that covers a lower surface of the first reinforcement material,
the first resin layer is thinner than the second resin layer, and the first reinforcement material is located about the middle of a total thickness of the first insulation layer and the second wiring structure combined.

10. The wiring substrate according to claim 8, wherein the second reinforcement material is located in the middle of the second insulation layer in the thicknesswise direction.

11. The wiring substrate according to claim 8, wherein
the via wire is formed in a through hole that extends through the first insulation layer in the thicknesswise direction,
the upper end surface of the via wire is flush with the upper surface of the first insulation layer, and
the wiring substrate further comprises a seed layer that electrically connects the lowermost first wiring layer of the second wiring structure and the upper end surface of the via wire.

12. The wiring substrate according to claim 8, wherein the outermost insulation layer has a thickness that is greater than or equal to a total thickness of all of the third insulation layers of the second wiring structure.

13. The wiring substrate according to claim 8, wherein
the plurality of third insulation layers include a lowermost third insulation layer formed on the upper surface of the first insulation layer to cover the lowermost first wiring layer, and
an upper surface of the lowermost third insulation layer has a lower surface roughness than the upper surface of the first insulation layer.

14. The wiring substrate according to claim 1, wherein
the first insulation layer is one of a plurality of first insulation layers stacked on the upper surface of the core substrate, each of the first insulation layers being formed from the thermosetting insulative resin including the first reinforcement material,
the second insulation layer is one of a plurality of second insulation layers stacked on the lower surface of the core substrate, each of the second insulation layers being formed from the thermosetting insulative resin including the second reinforcement material,
the second wiring structure is stacked on an upper surface of the uppermost one of the plurality of first insulation layers, and
the outermost insulation layer is stacked on a lower surface of the lowermost one of the plurality of second insulation layers.

15. The wiring substrate according to claim 8, wherein
the first insulation layer is one of a plurality of first insulation layers stacked on the upper surface of the core substrate, each of the first insulation layers being formed from the thermosetting insulative resin including the first reinforcement material,
the second insulation layer is one of a plurality of second insulation layers stacked on the lower surface of the core substrate, each of the second insulation layers being formed from the thermosetting insulative resin including the second reinforcement material,
the second wiring structure is stacked on an upper surface of the uppermost one of the plurality of first insulation layers, and
the outermost insulation layer is stacked on a lower surface of the lowermost one of the plurality of second insulation layers.

16. A semiconductor device comprising:
a first semiconductor package that includes
the wiring substrate according to claim 1, and
a semiconductor chip flip-chip-mounted on the pad of the uppermost first wiring layer of the second wiring structure;
a second semiconductor package stacked on the first semiconductor package with a connection terminal located in between; and
an encapsulation resin filling a gap between the first semiconductor package and the second semiconductor package.

* * * * *